United States Patent
Watanabe et al.

(10) Patent No.: US 8,152,928 B2
(45) Date of Patent: Apr. 10, 2012

(54) SUBSTRATE CLEANING METHOD, SUBSTRATE CLEANING SYSTEM AND PROGRAM STORAGE MEDIUM

(75) Inventors: Tsukasa Watanabe, Nirasaki (JP); Naoki Shindo, Nirasaki (JP); Koukichi Hiroshiro, Tosu (JP); Yuji Kamikawa, Tosu (JP)

(73) Assignee: Tokyo Electron Limited, Tokyo (JP)

( * ) Notice: Subject to any disclaimer, the term of this patent is extended or adjusted under 35 U.S.C. 154(b) by 484 days.

(21) Appl. No.: 11/798,599

(22) Filed: May 15, 2007

(65) Prior Publication Data

US 2007/0267040 A1 Nov. 22, 2007

(30) Foreign Application Priority Data

May 19, 2006 (JP) ................. 2006-140377

(51) Int. Cl.
- *B08B 6/00* (2006.01)
- *B08B 7/00* (2006.01)
- *B08B 7/02* (2006.01)
- *B08B 3/12* (2006.01)
- *H01L 21/304* (2006.01)

(52) U.S. Cl. ............... 134/1; 134/1.3; 134/42; 134/36; 134/26; 134/34

(58) Field of Classification Search ............... 134/1, 1.3, 134/34, 36, 42, 26, 56 R, 184
See application file for complete search history.

(56) References Cited

U.S. PATENT DOCUMENTS

| 5,579,792 | A | * | 12/1996 | Stanasolovich et al. ....... 134/184 |
| 5,800,626 | A | * | 9/1998 | Cohen et al. ................. 134/1.3 |
| 5,901,716 | A | | 5/1999 | Hwang et al. |
| 5,976,311 | A | | 11/1999 | Han |
| 6,039,055 | A | * | 3/2000 | Akatsu ....................... 134/1.3 |
| 6,048,405 | A | * | 4/2000 | Skrovan et al. .................. 134/1 |
| 6,235,641 | B1 | * | 5/2001 | Christenson ................. 438/706 |
| 6,337,030 | B1 | | 1/2002 | Sakaguchi |
| 7,111,632 | B2 | * | 9/2006 | Berman et al. .............. 134/184 |
| 7,237,562 | B2 | * | 7/2007 | Shibayama ................ 134/56 R |
| 2002/0002767 | A1 | | 1/2002 | Yanagita et al. |
| 2002/0139390 | A1 | | 10/2002 | Okano et al. |

(Continued)

FOREIGN PATENT DOCUMENTS

EP 0 856 873 8/1998

(Continued)

OTHER PUBLICATIONS

Korean Office Action received in KR 10-2007-0039728. Mailed Oct. 5, 2010 and English translation.

*Primary Examiner* — Michael Kornakov
*Assistant Examiner* — Katelyn Whatley
(74) *Attorney, Agent, or Firm* — Smith, Gambrell & Russell, LLP

(57) ABSTRACT

A substrate cleaning method can uniformly removing particles from substrates at a high removing efficiency. The substrate cleaning method includes the steps of immersing substrates W in a cleaning liquid in a cleaning tank 12, and generating ultrasonic waves in the cleaning liquid contained in the cleaning tank. A region in the cleaning tank toward which the cleaning liquid is supplied is varied with respect to a vertical level in the step of generating ultrasonic waves in the cleaning liquid while the cleaning liquid is being supplied into the cleaning tank.

8 Claims, 12 Drawing Sheets

U.S. PATENT DOCUMENTS

| | | | |
|---|---|---|---|
| 2002/0144708 A1* | 10/2002 | Kashkoush et al. | 134/1.3 |
| 2002/0166569 A1 | 11/2002 | Harvey | |
| 2007/0131254 A1* | 6/2007 | Kin et al. | 134/26 |
| 2008/0105286 A1* | 5/2008 | Kizawa et al. | 134/56 R |

FOREIGN PATENT DOCUMENTS

| | | | |
|---|---|---|---|
| EP | 0 856 874 | | 8/1998 |
| JP | 10-109072 | | 4/1998 |
| JP | 2001-274133 A | | 10/2001 |
| JP | 2001274133 A | * | 10/2001 |
| JP | 2001284306 A | * | 10/2001 |
| JP | 2006-102684 A | | 4/2006 |
| JP | 2006-108512 A | | 4/2006 |
| KR | 0261175 | | 7/2000 |

* cited by examiner

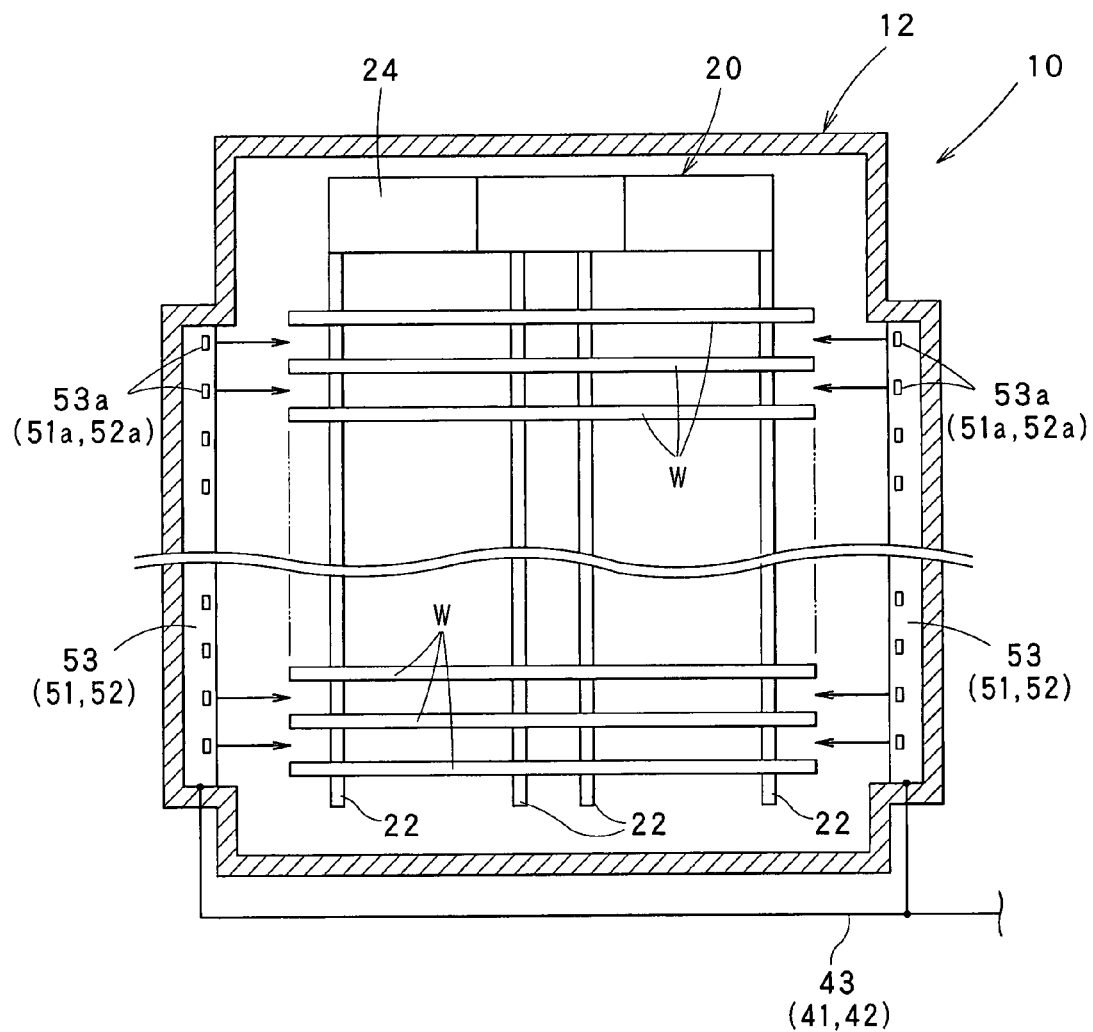
F I G. 2

SUBSTRATE CLEANING METHOD, SUBSTRATE CLEANING SYSTEM AND PROGRAM STORAGE MEDIUM

CROSS REFERENCE TO RELATED APPLICATIONS

This application is based upon and claims the benefit of priority from the prior Japanese Patent Application No. 2006-140377 filed on May 19, 2006, the entire contents of which are incorporated herein by reference.

BACKGROUND OF THE INVENTION

1. Field of the Invention

The present invention relates to a substrate cleaning method and a substrate cleaning system for removing particles (foreign matters) adhering to a substrate to be cleaned by immersing the substrate in a cleaning liquid and generating ultrasonic waves in the cleaning liquid. More particularly, the present invention relates to a substrate cleaning method and a substrate cleaning system capable of removing particles from the entire surface of a substrate at a high removing efficiency.

The present invention relates also to a program storage medium storing a program for accomplishing a substrate cleaning method capable of removing particles from the entire surface of a substrate at a high removing efficiency.

2. Description of the Related Art

There is a known cleaning method, which cleans a substrate to be processed by immersing the substrate held by a holding member in a cleaning liquid and by generating ultrasonic waves in the cleaning liquid. This cleaning method is generally called an ultrasonic cleaning process, and also called a megasonic cleaning process. Various studies, such as those disclosed in Japanese Patent Laid-Open Publication No. 10-109072 and Japanese Patent Laid-Open Publication No. 2005-296868, have been made to enhance the cleaning efficiency of ultrasonic cleaning.

SUMMARY OF THE INVENTION

Generally, ultrasonic waves are radiated from below a cleaning tank. Therefore, particles adhering to an upper part of the surface of a substrate located in an upper region in the cleaning tank and those adhering to a lower part of the substrate located in a lower region in the cleaning tank are removed at different removing efficiencies, respectively. Thus it is possible that particles adhering to some part of the surface of the substrate are removed at a low removing efficiency.

The present invention has been made in view of such a problem and it is therefore an object of the present invention to provide a substrate cleaning method and a substrate cleaning system capable of uniformly removing particles from a substrate at a high removing efficiency.

Another object of the present invention is to provide a program for accomplishing a substrate cleaning method capable of uniformly removing particles from the entire surface of a substrate at a high removing efficiency, and to provide a program storage medium storing the same program.

A first substrate cleaning method according to the present invention includes the steps of: immersing a substrate in a cleaning liquid in a cleaning tank; and generating ultrasonic waves in the cleaning liquid contained in the cleaning tank while the cleaning liquid is being supplied into the cleaning tank so as to replace the cleaning liquid with new one in the cleaning tank; wherein a region in the cleaning tank toward which the cleaning liquid is supplied is varied with respect to a vertical level in the step of generating ultrasonic waves in the cleaning liquid while the cleaning liquid is being supplied into the cleaning tank.

In the first substrate cleaning method according to the present invention, the cleaning liquid may be supplied into the cleaning tank through supplying members respectively disposed at different positions with respect to the vertical level in the step of generating ultrasonic waves in the cleaning liquid while the cleaning liquid is being supplied into the cleaning tank, and a supplying member, used for supplying the cleaning liquid into the cleaning tank, of the supplying members may be varied in the same step so that the region in the cleaning tank toward which the cleaning liquid is supplied is varied with respect to the vertical level.

A second substrate cleaning method according to the present invention includes the steps of: immersing a substrate in a cleaning liquid in a cleaning tank; and generating ultrasonic waves in the cleaning liquid contained in the cleaning tank while the cleaning liquid is being supplied into the cleaning tank so as to replace the cleaning liquid with new one in the cleaning tank; wherein the cleaning liquid is supplied into the cleaning tank through supplying members respectively disposed at different positions with respect to a vertical level in the step of generating ultrasonic waves in the cleaning liquid while the cleaning liquid is being supplied into the cleaning tank.

In the second substrate cleaning method according to the present invention, a supplying member, used for supplying the cleaning liquid into the cleaning tank, of the supplying members may be varied so that a region in the cleaning tank toward which the cleaning liquid is supplied can be varied with respect to the vertical level in the step of generating ultrasonic waves in the cleaning liquid while the cleaning liquid is being supplied into the cleaning tank.

In the first or second substrate cleaning method according to the present invention, a supplying rate at which at least one of the supplying members supplies the cleaning liquid may be varied in the step of generating ultrasonic waves in the cleaning liquid while the cleaning liquid is being supplied into the cleaning tank.

In the first or second substrate cleaning method according to the present invention, a dissolved gas concentration of the cleaning liquid supplied through at least one of the supplying members may be varied in the step of generating ultrasonic waves in the cleaning liquid while the cleaning liquid is being supplied into the cleaning tank.

In the first or second substrate cleaning method according to the present invention, bubbles may be supplied together with the cleaning liquid into the cleaning tank through at least one of the supplying members in the step of generating ultrasonic waves in the cleaning liquid while the cleaning liquid is being supplied into the cleaning tank, and a bubble supplying rate at which the bubbles are supplied through at least one of said at least one of the supplying members may be varied in the same step. Alternatively, in the first or second substrate cleaning method according to the present invention, bubbles may be supplied together with the cleaning liquid into the cleaning tank through at least one of the supplying members in the step of generating ultrasonic waves in the cleaning liquid while the cleaning liquid is being supplied into the cleaning tank, and the number of bubbles supplied in a unit time through at least one of said at least one of the supplying members may be varied in the same step.

In the first or second substrate cleaning method according to the present invention, a supplying rate at which the cleaning liquid is supplied through one of the supplying members and a supplying rate at which the cleaning liquid is supplied through another one of the supplying members disposed at a position different from a position at which the former supplying member is disposed with respect to the vertical level may be different.

In the first or second substrate cleaning method according to the present invention, a dissolved gas concentration of the cleaning liquid supplied through one of the supplying members and a dissolved gas concentration of the cleaning liquid supplied through another one of the supplying members disposed at a position different from a position at which the former supplying member is disposed with respect to the vertical level may be different.

In the first or second substrate cleaning method according to the present invention, bubbles may be supplied together with the cleaning liquid into the cleaning tank through at least two of the supplying members in the step of generating ultrasonic waves in the cleaning liquid while the cleaning liquid is being supplied into the cleaning tank, and a bubble supplying rate at which the bubbles are supplied through one of the at least two supplying members and a bubble supplying rate at which the bubbles are supplied through another one of the at least two supplying members disposed at a position different from a position at which the former supplying member is disposed with respect to the vertical level may be different. Alternatively, in the first or second substrate cleaning method according to the present invention, bubbles may be supplied together with the cleaning liquid into the cleaning tank through at least two of the supplying members in the step of generating ultrasonic waves in the cleaning liquid while the cleaning liquid is being supplied into the cleaning tank, and the number of bubbles supplied in a unit time through one of the at least two supplying members and the number of bubbles supplied in a unit time through another one of the at least two supplying members disposed at a position different from a position at which the former supplying member is disposed with respect to the vertical level may be different.

In the first substrate cleaning method according to the present invention, the cleaning liquid may be supplied into the cleaning tank through a supplying member in the step of generating ultrasonic waves in the cleaning liquid while the cleaning liquid is being supplied into the cleaning tank, and the supplying member may be moved vertically in the same step.

In such a substrate cleaning method, a supplying rate at which the cleaning liquid is supplied through the supplying member may be varied in the step of generating ultrasonic waves in the cleaning liquid while the cleaning liquid is being supplied into the cleaning tank. Alternatively, in such a substrate cleaning method, the dissolved gas concentration of the cleaning liquid supplied through the supplying member may be varied in the step of generating ultrasonic waves in the cleaning liquid while the cleaning liquid is being supplied into the cleaning tank. Alternatively, in such a substrate cleaning method, bubbles may be supplied together with the cleaning liquid into the cleaning tank through the supplying member in the step of generating ultrasonic waves in the cleaning liquid while the cleaning liquid is being supplied into the cleaning tank, and a bubble supplying rate at which the bubbles are supplied through the supplying member may be varied in the same step. Alternatively, in such a substrate cleaning method, bubbles may be supplied together with the cleaning liquid into the cleaning tank through the supplying member in the step of generating ultrasonic waves in the cleaning liquid while the cleaning liquid is being supplied into the cleaning tank, and the number of bubbles supplied in a unit time through the supplying member may be varied in the same step.

A third substrate cleaning method according to the present invention includes the steps of: immersing a substrate in a cleaning liquid in a cleaning tank; and generating ultrasonic waves in the cleaning liquid contained in the cleaning tank while bubbles are being supplied into the cleaning tank; wherein a region in the cleaning tank toward which the bubbles are supplied is varied with respect to a vertical level in the step of generating ultrasonic waves in the cleaning liquid while the bubbles are being supplied into the cleaning tank.

In the third substrate cleaning method according to the present invention, the bubbles may be supplied into the cleaning tank through bubble supplying members respectively disposed at different positions with respect to the vertical level in the step of generating ultrasonic waves in the cleaning liquid while the bubbles are being supplied into the cleaning tank, and a bubble supplying member, used for supplying the bubbles into the liquid tank, of the bubble supplying members may be varied in the same step so that the region in the cleaning tank toward which the bubbles are supplied can be varied with respect to the vertical level.

A fourth substrate cleaning method according to the present invention includes the steps of: immersing a substrate in a cleaning liquid in a cleaning tank; and generating ultrasonic waves in the cleaning liquid contained in the cleaning tank while bubbles are being supplied into the cleaning tank; wherein the bubbles are supplied into the cleaning tank through bubble supplying members respectively disposed at different positions with respect to a vertical level in the step of generating ultrasonic waves in the cleaning liquid while the bubbles are being supplied into the cleaning tank.

In the fourth substrate cleaning method according to the present invention, a bubble supplying member, used for supplying the bubbles into the cleaning tank, of the bubble supplying members may be varied so that a region in the cleaning tank toward which the bubbles are supplied can be varied with respect to the vertical level in the step of generating ultrasonic waves in the cleaning liquid while the bubbles are supplied into the cleaning tank.

In the third or fourth substrate cleaning method according to the present invention, a bubble supplying rate at which at least one of the bubble supplying members supplies the bubbles may be varied in the step of generating ultrasonic waves in the cleaning liquid while the bubbles are being supplied into the cleaning tank.

In the third or fourth substrate cleaning method according to the present invention, the number of bubbles supplied in a unit time through at least one of the bubble supplying members may be varied in the step of generating ultrasonic waves in the cleaning liquid while the bubbles are being supplied into the cleaning tank.

In the third or fourth substrate cleaning method according to the present invention, a bubble supplying rate at which the bubbles are supplied through one of the bubble supplying members and a bubble supplying rate at which the bubbles are supplied through another one of the bubble supplying members disposed at a position different from a position at which the former bubble supplying member is disposed with respect to the vertical level may be different. Alternatively, in the third or fourth substrate cleaning method according to the present invention, the number of bubbles supplied in a unit time through one of the bubble supplying members and the number of bubbles supplied in a unit time through another one of the bubble supplying members disposed at a position different from a position at which the former bubble supplying member is disposed with respect to the vertical level may be different.

In the third substrate cleaning method according to the present invention, the bubbles may be supplied into the cleaning tank through a supplying member in the step of generating ultrasonic waves in the cleaning liquid while the bubbles are being supplied into the cleaning tank, and the bubble supplying member may be vertically moved in the same step. In such a substrate cleaning method, a bubble supplying rate at which the bubbles are supplied through the bubble supplying member may be varied in the step of generating ultrasonic waves in the cleaning liquid while the bubbles are being supplied into the cleaning tank. Alternatively, in such a substrate cleaning method, the number of bubbles supplied in a unit time through the bubble supplying member may be varied in the step of generating ultrasonic waves in the cleaning liquid while the bubbles are being supplied into the cleaning tank.

A first substrate cleaning system according to the present invention includes: a cleaning tank that contains a cleaning liquid; an ultrasonic generator that generates ultrasonic waves in the cleaning liquid contained in the cleaning tank; and supplying members respectively disposed at different positions with respect to a vertical level so as to supply the cleaning liquid into the cleaning tank respectively from different positions with respect to the vertical level.

The first substrate cleaning system according to the present invention may further include: a cleaning liquid deliver device connected to the supplying members so as to deliver the cleaning liquid to the supplying members; and a cleaning liquid distributing mechanism interposed between the cleaning liquid deliver device and the supplying members so as to connect the supplying members selectively to the cleaning liquid deliver device.

The first substrate cleaning system according to the present invention may further include a control device connected to the cleaning liquid distributing mechanism so as to control operations of the cleaning liquid distributing mechanism; wherein the control device may control the cleaning liquid distributing mechanism such that the supplying members are connected selectively to the cleaning liquid deliver device in order that a supplying member, used for supplying the cleaning liquid into the cleaning tank, of the supplying members is varied while the ultrasonic generator is generating ultrasonic waves in the cleaning liquid contained in the cleaning tank.

The first substrate cleaning system according to the present invention may further include: a flow adjusting mechanism interposed between at least one of the supplying members and the cleaning liquid distributing mechanism so as to adjust a cleaning liquid supplying rate at which the cleaning liquid is supplied through the associated supplying member into the cleaning tank; and a control device connected to the flow adjusting mechanism so as to control operations of the flow adjusting mechanism; wherein the control device may control the flow adjusting mechanism such that the cleaning liquid supplying rate at which the cleaning liquid is supplied through the associated supplying member into the cleaning tank is varied while the ultrasonic generator is generating ultrasonic waves in the cleaning liquid contained in the cleaning tank.

The first substrate cleaning system according to the present invention may further include: a dissolved gas concentration adjusting device interposed between at least one of the supplying members and the cleaning liquid distributing mechanism so as to adjust a dissolved gas concentration of the cleaning liquid supplied through the associated supplying member into the cleaning tank; and a control device connected to the dissolved gas concentration adjusting device so as to control operations of the dissolved gas concentration adjusting device; wherein the control device may control the dissolved gas concentration adjusting device such that the dissolved gas concentration of the cleaning liquid supplied through the associated supplying member into the cleaning tank is varied while the ultrasonic generator is generating ultrasonic waves in the cleaning liquid contained in the cleaning tank.

The first substrate cleaning system according to the present invention may further include: a bubble forming unit interposed between at least one of the supplying members and the cleaning liquid distributing mechanism so as to form bubbles in the cleaning liquid supplied through the associated supplying member into the cleaning tank; and a control device connected to the bubble forming unit so as to control operations of the bubble forming unit; wherein the control device may control the bubble forming unit such that a bubble supplying rate at which the bubbles are supplied together with the cleaning liquid through the associated supplying member into the cleaning tank is varied while the ultrasonic generator is generating ultrasonic waves in the cleaning liquid contained in the cleaning tank. Alternatively, the first substrate cleaning system according to the present invention may further include: a bubble forming unit interposed between at least one of the supplying members and the cleaning liquid distributing mechanism so as to form bubbles in the cleaning liquid supplied through the associated supplying member into the cleaning tank; and a control device connected to the bubble forming unit so as to control operations of the bubble forming unit; wherein the control device may control the bubble forming unit such that the number of bubbles supplied in a unit time together with the cleaning liquid through the associated supplying member into the cleaning tank is varied while the ultrasonic generator is generating ultrasonic waves in the cleaning liquid contained in the cleaning tank.

A second substrate cleaning system according to the present invention includes: a cleaning tank that contains a cleaning liquid; an ultrasonic generator that generates ultrasonic waves in the cleaning liquid contained in the cleaning tank; and a vertically movable supplying member that supplies the cleaning liquid into the cleaning tank.

In the second substrate cleaning system according to the present invention, the supplying member may be adapted to be vertically moved while the ultrasonic generator is generating ultrasonic waves in the cleaning liquid contained in the cleaning tank.

The first or second substrate cleaning system according to the present invention may further include: a cleaning liquid deliver device connected to the supplying members so as to deliver the cleaning liquid to the supplying members; a dissolved gas concentration adjusting device interposed between the cleaning tank and the cleaning liquid deliver device so as to adjust a dissolved gas concentration of the cleaning liquid delivered by the cleaning liquid deliver device to the cleaning tank; and a control device connected to the dissolved gas concentration adjusting device so as to control operations of the dissolved gas concentration adjusting device; wherein the control device may control the dissolved gas concentration adjusting device such that the dissolved gas concentration of the cleaning liquid supplied into the cleaning tank is varied while the ultrasonic generator is generating ultrasonic waves in the cleaning liquid contained in the cleaning tank.

The first or second substrate cleaning system according to the present invention may further include: a cleaning liquid deliver device connected to the supplying members so as to deliver the cleaning liquid to the supplying members; a bubble forming unit interposed between the cleaning tank and the cleaning liquid deliver device so as to form bubbles in the cleaning liquid delivered by the cleaning liquid deliver device to the cleaning tank; and a control device connected to the bubble forming unit so as to control operations of the bubble forming unit; wherein the control device may control the bubble forming unit such that a bubble supplying rate at which the bubbles are supplied together with the cleaning liquid into the cleaning tank is varied while the ultrasonic generator is generating ultrasonic waves in the cleaning liquid contained in the cleaning tank. Alternatively, the first or second substrate cleaning system according to the present invention may further include: a cleaning liquid deliver device connected to the supplying members so as to deliver the cleaning liquid to the supplying members; a bubble forming unit interposed between the cleaning tank and the cleaning liquid deliver device so as to form bubbles in the cleaning liquid delivered by the cleaning liquid deliver device to the cleaning tank; and a control device connected to the bubble forming unit so as to control operations of the bubble forming unit; wherein the control device may control the bubble forming unit such that the number of bubbles supplied in a unit time together with the cleaning liquid into the cleaning tank is varied while the ultrasonic generator is generating ultrasonic waves in the cleaning liquid contained in the cleaning tank.

A third substrate cleaning system according to the present invention includes: a cleaning tank that contains a cleaning liquid; an ultrasonic generator that generates ultrasonic waves in the cleaning liquid contained in the cleaning tank; and bubble supplying members respectively disposed at different positions with respect to a vertical level so as to supply bubbles into the cleaning liquid contained in the cleaning tank respectively from different positions with respect to the vertical level.

In the third substrate cleaning system according to the present invention, a bubble supplying member, used for supplying the bubbles into the cleaning liquid contained in the cleaning tank, of the bubble supplying members may be adapted to be varied while the ultrasonic generator is generating ultrasonic waves in the cleaning liquid contained in the cleaning tank.

A fourth substrate cleaning system according to the present invention includes: a cleaning tank that contains a cleaning liquid; an ultrasonic generator that generates ultrasonic waves in the cleaning liquid contained in the cleaning tank; and a vertically movable supplying member that supplies bubbles into the cleaning liquid contained in the cleaning tank.

In the fourth substrate cleaning system according to the present invention, the bubble supplying member may be adapted to be vertically moved while the ultrasonic generator is generating ultrasonic waves in the cleaning liquid contained in the cleaning tank. The fourth substrate cleaning system according to the present invention may further include: a gas deliver device connected to the bubble supplying member so as to deliver a gas to the bubble supplying member; and a control device connected to the gas deliver device so as to control operations of the gas deliver device; wherein the control device may control the gas deliver device such that a bubble supplying rate at which the bubbles are supplied into the cleaning liquid contained in the cleaning tank is varied while the ultrasonic generator is generating ultrasonic waves in the cleaning liquid contained in the cleaning tank. The fourth substrate cleaning system according to the present invention may further include: a gas deliver device connected to the bubble supplying member so as to supply a gas to the bubble supplying member; and a control device connected to the gas deliver device so as to control operations of the gas deliver device; wherein the control device may control the gas deliver device such that the number of bubbles supplied into the cleaning liquid contained in the cleaning tank in a unit time is varied while the ultrasonic generator is generating ultrasonic waves in the cleaning liquid contained in the cleaning tank.

A first program according to the present invention is to be carried out by a control device for controlling a substrate processing system so as to accomplish a substrate processing method comprising the steps of: immersing a substrate in a cleaning liquid in a cleaning tank; and generating ultrasonic waves in the cleaning liquid contained in the cleaning tank while the cleaning liquid is being supplied into the cleaning tank so as to replace the cleaning liquid with new one in the cleaning tank;

wherein a region in the cleaning tank toward which the cleaning liquid is supplied is varied with respect to a vertical level in the step of generating ultrasonic waves in the cleaning liquid while the cleaning liquid is being supplied into the cleaning tank.

A second program according to the present invention is to be carried out by a control device for controlling a substrate processing system so as to accomplish a substrate processing method comprising the steps of: immersing a substrate in a cleaning liquid in a cleaning tank; and generating ultrasonic waves in the cleaning liquid contained in the cleaning tank while the cleaning liquid is being supplied into the cleaning tank so as to replace the cleaning liquid with new one in the cleaning tank; wherein the cleaning liquid is supplied into the cleaning tank through supplying members respectively disposed at different positions with respect to a vertical level in the step of generating ultrasonic waves in the cleaning liquid while the cleaning liquid is being supplied into the cleaning tank.

A third program according to the present invention is to be carried out by a control device for controlling a substrate processing system so as to accomplish a substrate processing method comprising the steps of: immersing a substrate in a cleaning liquid in a cleaning tank; and generating ultrasonic waves in the cleaning liquid contained in the cleaning tank while bubbles are being supplied into the cleaning tank; wherein a region in the cleaning tank toward which the bubbles are supplied is varied with respect to a vertical level in the step of generating ultrasonic waves in the cleaning liquid while the bubbles are being supplied into the cleaning tank.

A fourth program according to the present invention is to be carried out by a control device for controlling a substrate processing system so as to accomplish a substrate processing method comprising the steps of: immersing a substrate in a cleaning liquid in a cleaning tank; and generating ultrasonic waves in the cleaning liquid contained in the cleaning tank while bubbles are being supplied into the cleaning tank; wherein the bubbles are supplied into the cleaning tank through bubble supplying members respectively disposed at different positions with respect to a vertical level in the step of generating ultrasonic waves in the cleaning liquid while the bubbles are being supplied into the cleaning tank.

A first storage medium according to the present invention stores a program to be carried out by a control device for controlling a substrate processing system so as to accomplish a substrate processing method comprising the steps of: immersing a substrate in a cleaning liquid in a cleaning tank; and generating ultrasonic waves in the cleaning liquid contained in the cleaning tank while the cleaning liquid is being supplied into the cleaning tank so as to replace the cleaning liquid with new one in the cleaning tank; wherein a region in the cleaning tank toward which the cleaning liquid is supplied is varied with respect to a vertical level in the step of generating ultrasonic waves in the cleaning liquid while the cleaning liquid is being supplied into the cleaning tank.

A second storage medium according to the present invention stores a program to be carried out by a control device for controlling a substrate processing system so as to accomplish a substrate processing method comprising the steps of: immersing a substrate in a cleaning liquid in a cleaning tank; and generating ultrasonic waves in the cleaning liquid contained in the cleaning tank while the cleaning liquid is being supplied into the cleaning tank so as to replace the cleaning liquid with new one in the cleaning tank; wherein the cleaning liquid is supplied into the cleaning tank through supplying members respectively disposed at different positions with respect to a vertical level in the step of generating ultrasonic waves in the cleaning liquid while the cleaning liquid is being supplied into the cleaning tank.

A third storage medium according to the present invention stores a program to be carried out by a control device for controlling a substrate processing system so as to accomplish a substrate processing method comprising the steps of: immersing a substrate in a cleaning liquid in a cleaning tank; and generating ultrasonic waves in the cleaning liquid contained in the cleaning tank while bubbles are being supplied into the cleaning tank; wherein a region in the cleaning tank toward which the bubbles are supplied is varied with respect to a vertical level in the step of generating ultrasonic waves in the cleaning liquid while the bubbles are being supplied into the cleaning tank.

A fourth storage medium according to the present invention stores a program to be carried out by a control device for controlling a substrate processing system so as to accomplish a substrate processing method comprising the steps of: immersing a substrate in a cleaning liquid in a cleaning tank; and generating ultrasonic waves in the cleaning liquid contained in the cleaning tank while bubbles are being supplied into the cleaning tank; wherein the bubbles are supplied into the cleaning tank through bubble supplying members respectively disposed at different positions with respect to a vertical level in the step of generating ultrasonic waves in the cleaning liquid while the bubbles are being supplied into the cleaning tank.

The present invention has an effect on improving uniformly removing particles from substrates and an effect on enhancing particle removing efficiency.

BRIEF DESCRIPTION OF THE DRAWINGS

FIG. 2 is a cross-sectional view taken on the line II-II in FIG. 1;

DESCRIPTION OF THE PREFERRED EMBODIMENTS

Preferred embodiment of the present invention will be described with reference to the accompanying drawings. The present invention will be described as applied to a semiconductor wafer cleaning system. However, the present invention is not limited to the semiconductor wafer cleaning system and can be applied widely to cleaning substrates.

Figure 1:
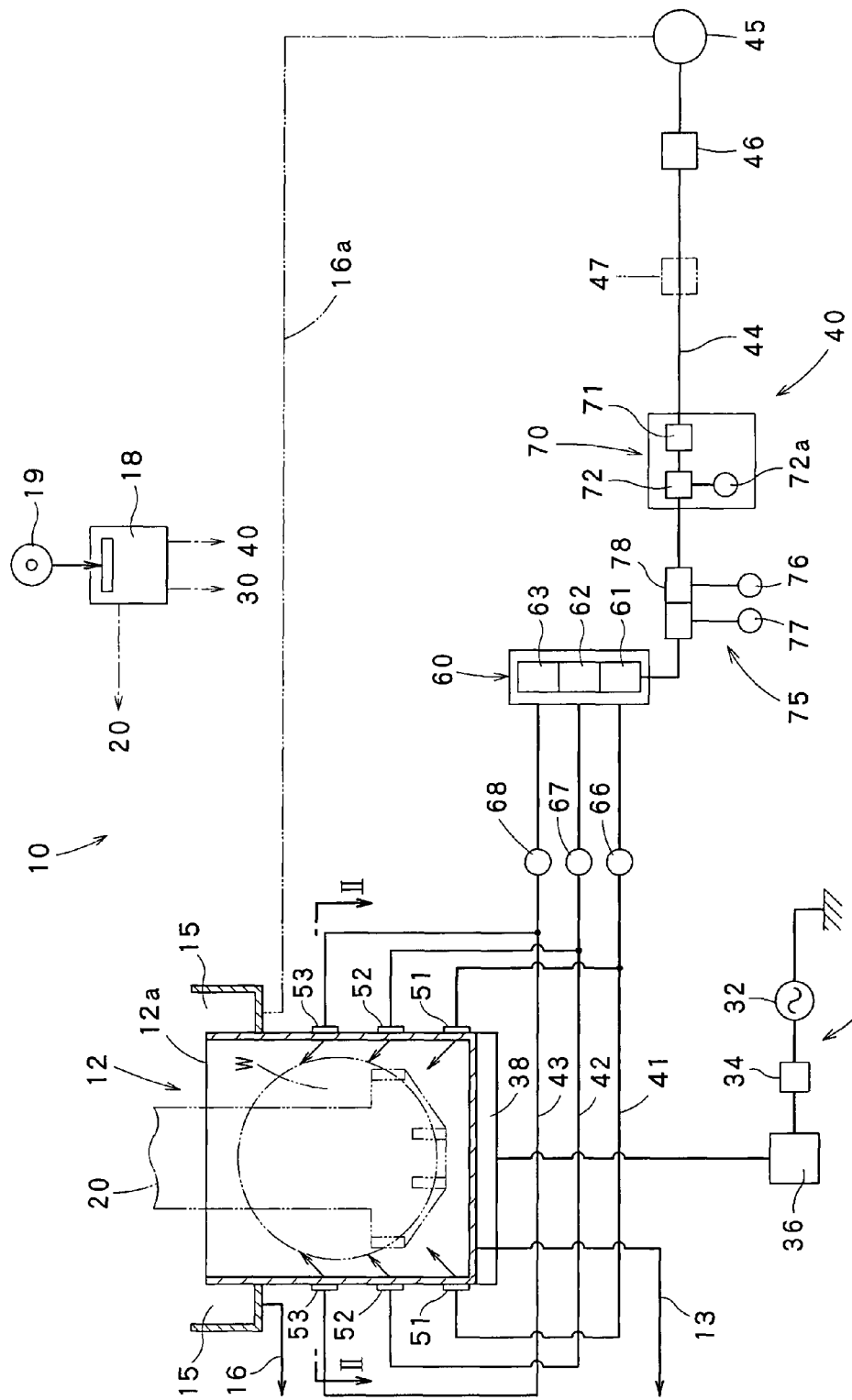
FIG. 1 is a schematic view showing a substrate cleaning system in one embodiment according to the present invention.
Figure 3:
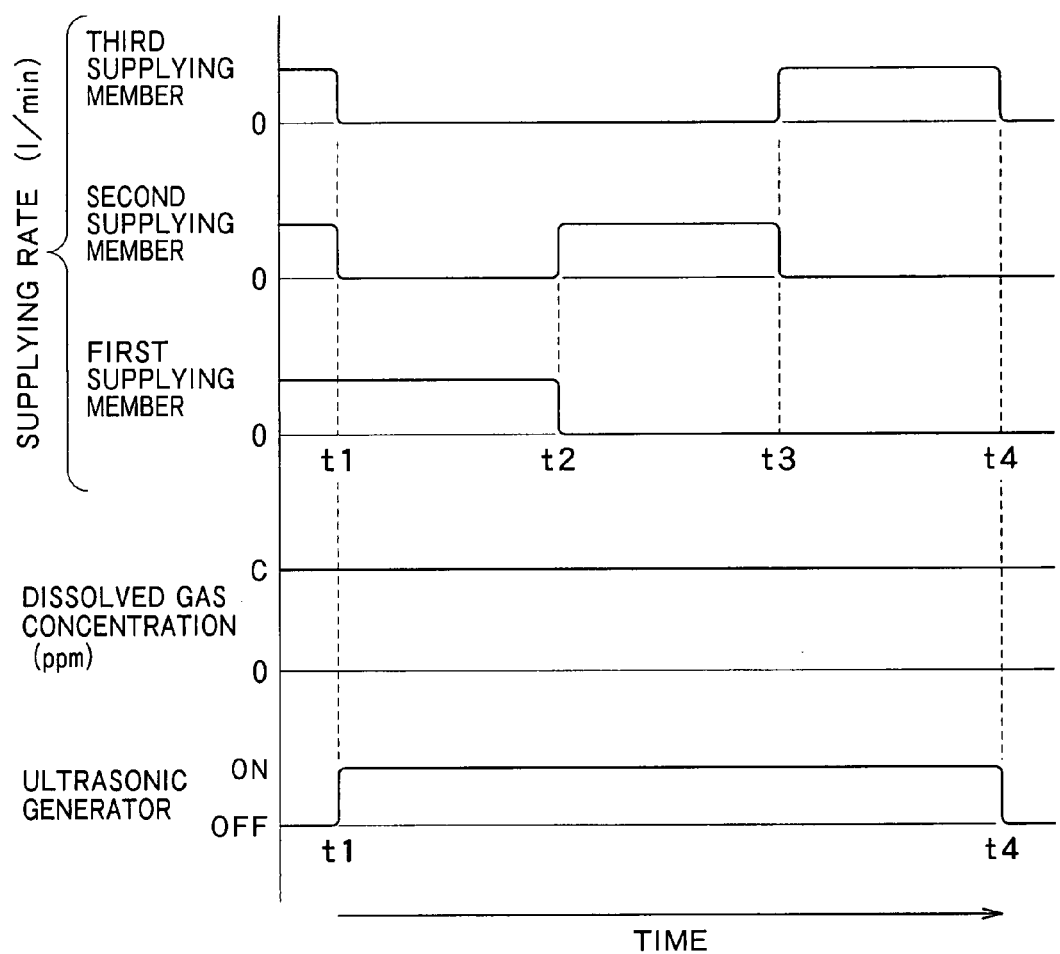
FIG. 3 is a diagram for explaining a substrate cleaning method in one embodiment according to the present invention.
Figure 4:
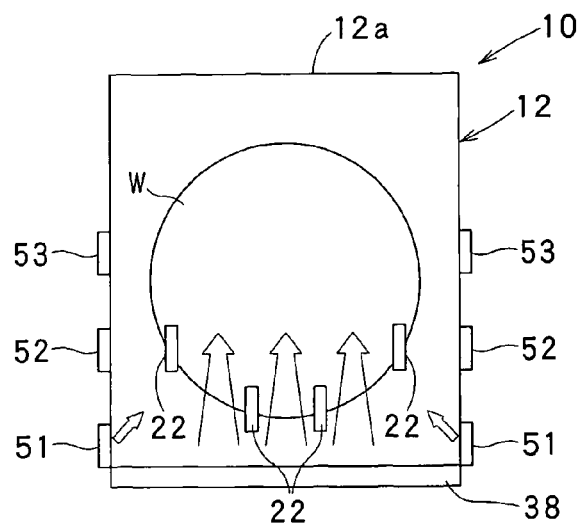
FIG. 4 is a view for explaining a mode of propagation of ultrasonic waves in a cleaning liquid.
Figure 5:
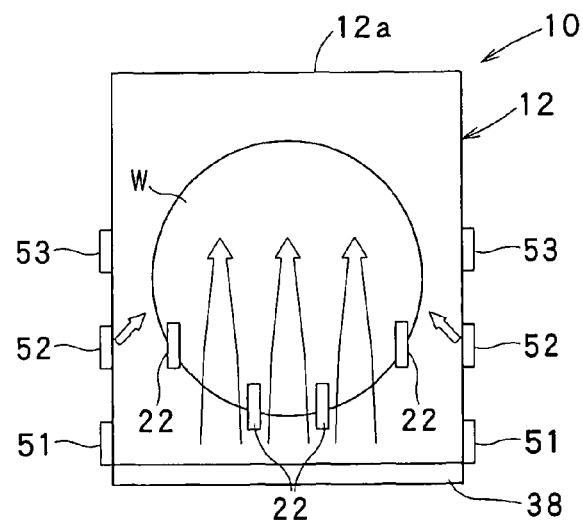
FIG. 5 is a view for explaining a mode of propagation of ultrasonic waves in a cleaning liquid.
Figure 6:
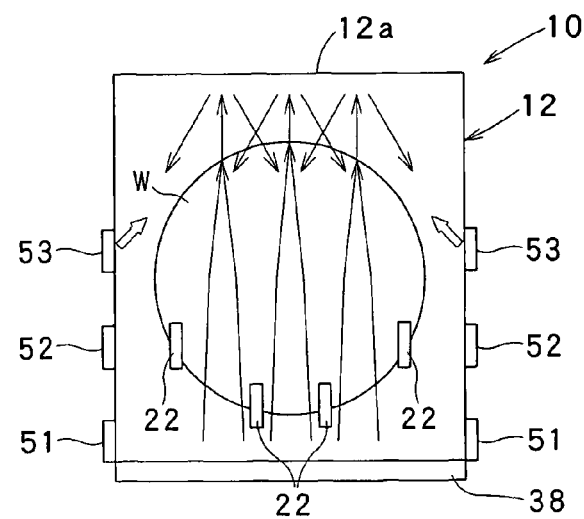
FIG. 6 is a view for explaining a mode of propagation of ultrasonic waves in a cleaning liquid.

FIGS. 1 to 6 are views showing a substrate cleaning system, a substrate cleaning method, a program and a storage medium in a this embodiment according to the present invention. FIG. 1 is a schematic view of the substrate cleaning system in the first embodiment, FIG. 2 is a cross-sectional view taken on the line II-II in FIG. 1, FIG. 3 is a diagram showing an operating mode of an ultrasonic generator, and variation of a supplying rate at which a cleaning liquid is supplied into a cleaning tank and a concentration of the cleaning liquid, and FIGS. 4 to 6 are views of assistance in explaining a mode of propagation of ultrasonic waves in a cleaning liquid.

Referring to FIG. 1, a substrate cleaning system 10 in a this embodiment according to the present invention includes a cleaning tank (DIP tank) 12, a cleaning liquid supply system 40 connected to the cleaning tank 12 so as to supply a cleaning liquid into the cleaning tank 12, a wafer boat 20 for holding wafers (substrate to be processed) W, a ultrasonic generator 30 for generating ultrasonic waves in the cleaning liquid contained in the cleaning tank 12, and a control device 18 connected to the cleaning liquid supply system 40 and the ultrasonic generator 30. The substrate cleaning system 10 immerses wafers W in the cleaning liquid contained in the cleaning tank 12 and generates ultrasonic waves in the cleaning liquid so as to clean the wafers W by ultrasonic cleaning.

Referring to FIG. 1, the cleaning liquid supply system 40 includes first supplying members 51, second supplying members 52 and third supplying members 53 attached to the cleaning tank 12 so as to supply the cleaning liquid into the cleaning tank 12, a cleaning liquid source (for example, cleaning liquid storage tank) 45 containing the cleaning liquid, and a cleaning liquid deliver device 46 for sending the cleaning liquid to the supplying members 51, 52 and 53. As shown in FIG. 1, the first supplying members 51, the second supplying members 52 and the third supplying members 53 are attached to parts of the side wall of the cleaning tank 12 at different positions with respect to a vertical level, respectively. A cleaning liquid distributing mechanism 60 is interposed between the cleaning liquid deliver device 46 and the supplying members 51, 52 and 53. The cleaning liquid distributing mechanism 60 distributes the cleaning liquid supplied thereto by the cleaning liquid deliver device 46 to the supplying members 51, 52 and 53. Component members of the cleaning liquid supply system 40 will be described in more detail.

First of all, the cleaning liquid source 45 and the cleaning liquid deliver device 46 will be described. The cleaning liquid source 45 may be, for example, known storage equipment, such as a tank for storing the cleaning liquid. In this embodiment, the cleaning liquid source 45 stores pure water (DIW) as a cleaning liquid. The cleaning liquid deliver device 46 may be known equipment, such as a pump. More concretely, the cleaning liquid deliver device 46 may be an air-driven bellows pump. The discharge rate (supplying rate) of the air-driven bellows pump can be adjusted by adjusting air pressure applied thereto. As shown in FIG. 1, the cleaning liquid source 45 and the cleaning liquid deliver device 46 are connected by a connecting pipe 44. The connecting pipe 44 extends to the cleaning liquid distributing mechanism 60.

The control device 18 connected to the cleaning liquid supply system 40 controls the cleaning liquid supply system 40. More concretely, the control device 18 starts and stops the cleaning liquid deliver device 46, and the supplying rate at which the cleaning liquid is supplied when the cleaning liquid deliver device 46 is driven for operation. When the cleaning liquid deliver device 46 is an air-driven bellows pump, the discharge rate of the air-driven bellows pump, namely, the cleaning liquid deliver device 46 can be controlled by controlling air pressure applied to the air-driven bellows pump. When the cleaning liquid deliver device 46 is a pumping device other than an air-driven bellows pump, such as an electric pump, the discharge rate of the electric pump, namely, the cleaning liquid deliver device 46, can be controlled by controlling power supplied to the electric motor.

Referring to FIG. 1, in this embodiment, the cleaning liquid distributing mechanism 60 includes three valves, namely, a first valve 61, a second valve 62 and a third valve 63. A first supply pipe 41, a second supply pipe 42 and a third supply pipe 43 are connected to the valves 61, 62 and 63, respectively. The valves 61, 62 and 63 are operated to connect the connecting pipe 44 to or to disconnect the connecting pipe 44 from the supply pipes 41, 42 and 43, respectively. The control device 18 is connected to the cleaning liquid distributing mechanism 60. The valves 61, 62 and 63 are opened or closed according to control signals provided by the control device 18 to connect the supply pipes 41, 42 and 43 to or to disconnect the same from the connecting pipe 44.

The cleaning liquid distributing mechanism 60 shown and explained herein is only an example and can be replaced with known equipment or a known mechanism capable of distributing the cleaning liquid supplied through the connecting pipe 44 selectively to the supply pipes 41, 42 and 43.

As shown in FIG. 1, the first supply pipe 41, the second supply pipe 42 and the third supply pipe 43 extending from the cleaning liquid distributing mechanism 60 are connected to the first supplying members 51, the second supplying members 52 and the third supplying members 53, respectively. The first supplying members 51 are attached to the side wall of the cleaning tank 12 at a lower position (lower vertical level). The second supplying members 52 are attached to the side wall of the cleaning tank 12 at a middle position (middle vertical level). The third supplying members 53 are attached to the side wall of the cleaning tank 12 at an upper position (upper vertical level). The first supplying members 51, the second supplying members 52 and the third supplying members 53 supply the cleaning liquid into the cleaning tank 12 from positions at the lower position, the middle position and the upper position, respectively. As shown in FIG. 1, the cleaning liquid supplied through the first supplying members 51 is directed mainly toward a region around a lower part of each of the wafers W placed in the cleaning tank 12. As shown in FIG. 1, the cleaning liquid supplied through the second supplying members 52 is directed mainly toward a region around a middle part of each of the wafers W placed in the cleaning tank 12. As shown in FIG. 1, the cleaning liquid supplied through the third supplying members 53 is directed mainly toward a region around an upper part of each of the wafers W placed in the cleaning tank 12.

FIG. 2 is a cross-sectional view of the cleaning tank 12. The third supplying members 53 are shown in FIG. 2. In this embodiment, the first supplying members 51, the second supplying members 52 and the third supplying members 53 are the same in construction and differ from each other only in position with respect to the vertical level.

Referring to FIGS. 1 and 2, the supplying members 51, 52 and 53 are pairs of cleaning nozzles (pairs of spouting members). The supplying nozzles 51, 52 and 53 are elongate tubular members horizontally extended along the opposite side walls of the cleaning tank 12. The cleaning nozzles constituting the first supplying members 51 are located at the same vertical level, and the same structure is applied to the cleaning nozzles constituting the second supplying members 52 and the cleaning nozzles constituting the third supplying members 53. As shown in FIG. 1, the first supplying members 51, the second supplying members 52 and the third supplying members 53 are at a lower position, a middle position and an upper position with respect to the vertical level, respectively. The first supplying members 51, the second supplying members 52 and the third supplying members 53, namely, the tubular members, are provided with supplying holes 51a, 52a and 53a, respectively. The supplying holes 51a, 52a and 53a are arranged at fixed longitudinal intervals. The positions of the supplying holes 51a, 52a and 53a are dependent on the positions of the wafers W supported on the wafer boat 20.

The supplying members 51, 52 and 53 are only examples and any suitable known supplying members may be used.

Referring to FIG. 1, the cleaning liquid supply system 40 further includes a first flow adjusting mechanism (first flow regulating device) 66, a second flow adjusting mechanism (second flow regulating device) 67 and a third flow adjusting mechanism (third flow regulating device) 68 placed respectively in the first supply pipe 41, the second supply pipe 42 and the third supply pipe 43 extending from the cleaning liquid distributing mechanism 60 respectively to the first supplying members 51, the second supplying members 52 and the third supplying members 53. The first flow adjusting mechanism 66 can regulate the flow of the cleaning liquid in the first supply pipe 41 so as to adjust a cleaning liquid supplying rate at which the cleaning liquid is supplied through the first supplying members 51 into the cleaning tank 12. The second flow adjusting mechanism 67 can regulate the flow of the cleaning liquid in the second supply pipe 42 so as to adjust a cleaning liquid supplying rate at which the cleaning liquid is supplied through the second supplying members 52 into the cleaning tank 12. The third flow adjusting mechanism 68 can regulate the flow of the cleaning liquid in the third supply pipe 43 so as to adjust a cleaning liquid supplying rate at which the cleaning liquid is supplied through the third supplying members 53 into the cleaning tank 12. The first flow adjusting mechanism 66, the second flow adjusting mechanism 67 and the third flow adjusting mechanism 68 may be known flow adjusting mechanisms, such as flow regulating valves.

The flow adjusting mechanisms 66, 67 and 68 operate according to signals provided by the control device 18 so as to regulate supplying rates at which the cleaning liquid is supplied through the supplying members 51, 52 and 53, respectively, into the cleaning tank 12.

As shown in FIG. 1, the cleaning liquid supply system 40 includes also a chemical supply unit 75 interposed between the cleaning liquid deliver device 46 and the cleaning liquid distributing mechanism 60 so as to supply a chemical element into pure water flowing through the connecting pipe 44. In this embodiment, the chemical supply unit 75 includes a mixing valve 78 placed in the connecting pipe 44, a first chemical source 76 and a second chemical source 77. The chemical sources 76 and 77 are connected to the mixing valve 78 so as to supply chemical elements to the mixing valve 78.

In this embodiment, the first chemical source 76 supplies hydrogen peroxide as a first chemical element, and the second chemical source 77 supplies ammonia as a second chemical element. Hydrogen peroxide and ammonia are supplied respectively from the first chemical source 76 and the second chemical source 77 into the connecting pipe 44. Thus hydrogen peroxide and ammonia are mixed in pure water in the connecting pipe 44 so as to supply a chemical solution, namely, an ammonia-hydrogen peroxide solution SC1 ($NH_4OH/H_2O_2/H_2O$) as the cleaning liquid into the cleaning tank 12.

The chemical supply unit 75 is connected to the control device 18 and supplies the chemical elements into the connecting pipe 44 according to signals provided by the control device 18.

As shown in FIG. 1, the cleaning liquid supply system 40 includes also a dissolved gas concentration adjusting device 70. The dissolved gas concentration adjusting device 70 is interposed between the cleaning liquid deliver device 46 and the cleaning liquid distributing mechanism 60 so as to adjust the dissolved gas concentration of the cleaning liquid supplied by the cleaning liquid deliver device 46 into the cleaning tank 12. The dissolved gas concentration adjusting device 70 is placed in the connecting pipe 44 so as to adjust the dissolved gas concentration of the cleaning liquid flowing through the connecting pipe 44. Dissolved gas concentration is the amount of a gas dissolved in the cleaning liquid in proportion to the amount of the cleaning liquid. The dissolved gas concentration of the cleaning liquid can be measured by a dissolved gas concentration measuring device on the market, such as "Analyzer Model 3610" available from Orbisphere Laboratories.

The dissolved gas concentration adjusting device 70 may include a deaerator 71 for removing gases from the cleaning liquid, a dissolving device 72 for dissolving a predetermined gas in the cleaning liquid and so on.

The deaerator 71 is a device for removing gases from the cleaning liquid flowing through the connecting pipe 44. The deaerator 71 may be any suitable one of known membrane deaerators and vacuum deaerators. The relation between the input to the deaerator 71 (for example, electric energy to be supplied) and the amount of gases corresponding to the input that can be removed from the cleaning liquid, namely, the reduction of the dissolved gas concentration corresponding to the input, is determined beforehand. An input to the deaerator 71 is determined according to a desired amount of gases to be removed on the basis of the thus determined relation and the determined input is supplied to the deaerator 71. Thus the dissolved gas concentration of the cleaning liquid flowing through the connecting pipe 44 can be reduced to a desired dissolved gas concentration.

The dissolving device 72 is connected to a gas source 72a. The dissolving device 72 is a device for dissolving a gas supplied by the gas source 72a in the cleaning liquid flowing through the connecting pipe 44. The dissolving device 72, similarly to the deaerator 71, may be any one of suitable known dissolving devices. The relation between the input to the dissolving device 72 (for example, electric energy to be supplied) and the amount of the gas corresponding to the input that can be dissolved in the cleaning liquid, namely, the increment of the dissolved gas concentration corresponding to the input, is determined beforehand. An input to the dissolving device 72 is determined on the basis of the thus determined relation. By supplying the determined input to the dissolving device 72, the dissolved gas concentration of the cleaning liquid flowing through the connecting pipe 44 can be increased to a desired dissolved gas concentration.

As sown in FIG. 1, the dissolved gas concentration adjusting device 70 includes the deaerator 71 and the dissolving device 72 on the downstream side of the deaerator 71. Gasses contained in the cleaning liquid flowing through the connecting pipe 44 is removed by the deaerator 71 such that the dissolved gas concentration of the cleaning liquid becomes 0%, and then the dissolved gas concentration of the cleaning liquid is adjusted by the dissolving device 72. Thus the cleaning liquid contains only the desired gas supplied from the gas source 72a in a desired dissolved gas concentration. The gas stored in the gas source 72a may be air, preferably, an inert gas, more preferably, nitrogen gas.

The dissolved gas concentration adjusting device 70 specifically described herein is only an example and various modifications of the dissolved gas concentration adjusting device 70 are possible. For example, the dissolved gas concentration adjusting device 70 may include only the deaerator 71 or may include only the dissolving device 72.

The dissolved gas concentration adjusting device 70 is connected to the control device 18. The dissolved gas concentration adjusting device 70 adjusts the dissolved gas concentration of the cleaning liquid according to signals provided by the control device 18.

The cleaning liquid supply system 40 may include a temperature adjusting device 47 as indicated by two-dot chain lines in FIG. 1. The temperature adjusting device 47 heats and/or cools the connecting pipe 44 so as to adjust the temperature of the cleaning liquid flowing through the connecting pipe 44. The temperature adjusting device 47 may be a known heating device or a known cooling device. Although the temperature adjusting device 47 shown in FIG. 1 is combined with the connecting pipe 44, a temperature adjusting device may be combined with any one of the supply pipes 41, 42 and 43 so as to adjust the temperature of the cleaning liquid flowing through the associated supply pipe or temperature adjusting devices may be combined with all the supply pipes 41, 42 and 43, respectively, so as to adjust the temperature of the cleaning liquid flowing through the supply pipes 41, 42 and 43.

The cleaning tank 12 into which the cleaning liquid is supplied by the cleaning liquid supply system 40 will be described. The cleaning tank 12 has a shape substantially resembling a rectangular solid as shown in FIGS. 1 and 2. The cleaning tank 12 has an open upper end 12a through which wafers W are carried into and carried out of the cleaning tank 12. A drain pipe 13 provided with a shutoff valve is connected to the bottom wall of the cleaning tank 12 so as to drain the cleaning liquid from the cleaning tank 12.

An outer tank (recovery tank) 15 surrounds the open upper end 12a of the cleaning tank 12 as shown in FIG. 1. The cleaning liquid overflowed the cleaning tank 12 is contained in the outer tank 15. A drain pipe 16 provided with a shutoff valve is connected to the outer tank 15 so as to drain the cleaning liquid from the outer tank 15.

The cleaning tank 123 and the outer tank 15 are made of a material having a high chemical resistance, such as quartz or the like. The cleaning liquid drained through the drainpipes 13 and 16 may be discharged from the substrate cleaning system 10 or may be supplied again through a filter to the cleaning tank 12. When the recovered cleaning liquid contained in the outer tank 15 is used again, the outer tank 15 may be connected to the cleaning liquid source 45 by a circulation pipe 16a, as indicated by two-dot chain lines in FIG. 1.

The wafer boat 20 for holding wafers W will be described. Referring to FIGS. 1 and 2, the wafer boat 20 has four support bars 22 extending along a horizontal direction parallel to the supplying members 51, 52 and 53, and a base 24 holding the support bars 22 in a cantilever fashion. A plurality of wafers W to be process at the same time, namely a batch formed of, for example, fifty wafers W is supported on the support bars 22. The support bars 22 are provided with grooves, not shown, longitudinally arranged at fixed intervals. The surfaces of the wafers W engaged in the grooves of the support bars 22 are substantially perpendicular to a direction in which the support bars 22 are extended. That is to say, the wafers W are supported on the wafer boat 20 with the surfaces thereof extended vertically as shown in FIG. 1.

As obvious from FIG. 2, pitches of the supplying holes 51a, 52a and 53a of the supplying members 51, 52 and 53 are substantially equal to pitches of the wafers W supported on the wafer boat 20. The supplying holes 51a, 52a and 53a of the supplying members 51, 52 and 53 are arranged so as to supply the cleaning liquid into spaces between the adjacent wafers W.

The base 24 of the wafer boat 20 is connected to a lifting mechanism, not shown. The lifting mechanism lowers the wafer boat 20 supporting the wafers W so as to immerse the wafers W in the cleaning liquid contained in the cleaning tank 12. The lifting mechanism is connected to the control device 18. The control device 18 controls the lifting mechanism so as to immerse the wafers W in the cleaning liquid.

The ultrasonic generator 30 will be described. As shown in FIG. 1, the ultrasonic generator 30 includes; vibrating members 38 attached to the outer surface of the bottom wall of the cleaning tank 12; a high-frequency power source 32 for driving the vibrating members 38; and an ultrasonic oscillator 34 connected to the high-frequency power source 32. In this embodiment, each of the vibrating members 38 covers a part of the outer surface of the bottom wall of the cleaning tank 12. As shown in FIG. 1, the ultrasonic generator 30 further includes a driving mode selector 36 connected to the ultrasonic oscillator 34 and the vibrating members 38. The driving mode selector 36 selects a total driving mode in which all the vibrating members 38 are driven for ultrasonic wave generation or a partial driving mode in which one or some of the vibrating members 38 are driven individually for ultrasonic wave generation.

The vibrating members 38 are driven for vibration. Then, ultrasonic waves are transmitted through the bottom wall of the cleaning tank 12 to the cleaning liquid contained in the cleaning tank 12. Thus ultrasonic waves are propagated in the cleaning liquid contained in the cleaning tank 12. The ultrasonic generator 30 is connected to the control device 18. The control device 18 controls the radiation (application) of ultrasonic waves to the cleaning liquid.

The control device 18 will be described. As mentioned above, the control device 18 is connected to the components of the substrate cleaning system 10 so as to control operations of those components. In this embodiment, the control device 18 includes a computer. The computer executes a program stored beforehand in a storage medium 19 so as to accomplish a wafer cleaning method by the substrate cleaning system 10.

A wafer cleaning method to be carried out by the substrate cleaning system 10 will be described by way of example with reference to FIGS. 3 to 6.

The control device 18 provides a signal to supply the cleaning liquid into the connecting pipe 44 by driving the cleaning liquid deliver device 46. The dissolved gas concentration adjusting device 70 adjusts the dissolved gas concentration of the cleaning liquid flowing through the connecting pipe 44 to a predetermined value according to a signal given thereto by the control device 18. The first chemical source 76 and the second chemical source 77 of the chemical supply unit 75 supply hydrogen peroxide and ammonia, respectively, into the connecting pipe 44 according to signals given thereto by the control device 18. Thus a chemical solution SC1 as the cleaning liquid, containing, for example, only nitrogen gas in a saturated concentration flows into the cleaning liquid distributing mechanism 60.

The control device 18 controls the output of the cleaning liquid deliver device 46 according to a predetermined program so as to adjust a supplying rate at which the cleaning liquid is supplied to the cleaning liquid distributing mechanism 60. The control device 18 controls supplying rates at which the chemical elements are supplied, respectively, into the connecting pipe 44 by the chemical sources 76 and 77 on the basis of the flow rate of the cleaning liquid (pure water) flowing through the connecting pipe 44.

The cleaning liquid distributing mechanism 60 connects all the supply pipes 41, 42 and 43 to the connecting pipe 44. Consequently, the cleaning liquid SC1 containing, for example, nitrogen gas in a predetermined dissolved gas concentration C is spouted through the supplying members 51, 52 and 53 as shown in FIG. 3.

In FIG. 3, time is expressed in, for example, minute and dissolved gas concentration is expressed in, for example, ppm. The tank 12 is filled up with the cleaning liquid SC1 having the predetermined dissolved gas concentration C by time t1.

The control device 18 drives the lifting mechanism, not shown, connected to the wafer boat 20 holding, for example, fifty wafers W so as to move the wafer boat 20 downward and so as to immerse the wafers W in the cleaning liquid contained in the cleaning tank 12.

Then, the control device 18 actuates the ultrasonic generator 30 so as to generate ultrasonic waves in the cleaning liquid contained in the cleaning tank 12. Thus the wafers W immersed in the cleaning liquid contained in the cleaning tank 12 are subjected to an ultrasonic cleaning process (megasonic process) so as to remove particles adhering to the surfaces of the wafers W.

As shown in FIG. 3, the cleaning liquid supply system 40 supplies the further cleaning liquid (chemical solution), i.e., replenishes the cleaning tank 12 with the cleaning liquid, continuously during the ultrasonic cleaning process such that the cleaning liquid is replaced partially with the replenished cleaning water. According to the predetermined program, the control device 18 varies supplying members used for supplying the cleaning liquid into the cleaning tank 12, in order to vary the position with respect to the vertical level from which the cleaning liquid is supplied into the cleaning tank 12. Hereby, a region in the cleaning tank 12 toward which the cleaning liquid is supplied is varied with respect to the vertical level. As shown in FIG. 3, in this embodiment, the cleaning liquid is supplied through the first supplying members 51 attached to the parts of the side walls of the cleaning tank 12 at the lower position in a period between times t1 and t2 into a region around lower parts of the surfaces of the wafers W immersed in the cleaning liquid in the cleaning tank 12 as shown in FIG. 4. The cleaning liquid is supplied through the second supplying members 52 attached to the parts of the side walls of the cleaning tank 12 at the middle position in a period between times t2 and t3 into a region around middle parts of the surfaces of the wafers W immersed in the cleaning liquid in the cleaning tank 12 as shown in FIG. 5. Then, the cleaning liquid is supplied through the third supplying members 53 attached to the parts of the side walls of the cleaning tank 12 at the upper position in a period between times t3 and t4 into a region around upper parts of the surfaces of the wafers W immersed in the cleaning liquid in the cleaning tank 12 as shown in FIG. 6.

As shown in FIGS. 1 and 2, the cleaning liquid is supplied through the supplying members 51, 52 and 53 obliquely upward at a predetermined angle into the spaces separating the adjacent wafers W held on the wafer boat 20. As the cleaning liquid is supplied continuously through at least one of the supplying members 51, 52 and 53, the cleaning liquid overflows the cleaning tank 12 together with particles removed from the wafers W into the outer tank 15. The cleaning liquid contained in the outer tank 15 may be discharged from the substrate cleaning system 10 or may be returned through the circulation pipe 16a into the cleaning liquid source 45.

As shown in FIG. 3, the step of generating ultrasonic waves in the cleaning liquid contained in the cleaning tank 12 by the ultrasonic generator 30 while the cleaning liquid supply system 40 is supplying the cleaning liquid into the cleaning tank 12 is continued between the times t1 and t4 for a time of, for example, 10 min.

In this embodiment, the position, with respect to the vertical level, from which the cleaning liquid is supplied into the cleaning tank 12 is changed while the wafers W are being processed by the ultrasonic cleaning process. In other word, the position at which the supplying members 51, 52 and 53 (in more detail, the supplying holes 51a, 52a and 53a of the supplying members 51, 52 and 53) used for supplying the cleaning liquid into the cleaning tank 12 is changed with respect to the vertical level while the wafers W are being processed by the ultrasonic cleaning process. As a result of this change, a region in the cleaning tank toward which the cleaning liquid is supplied is varied with respect to the vertical level in the step of generating ultrasonic waves in the cleaning liquid while the cleaning liquid is being supplied into the cleaning tank. According to this cleaning liquid supplying method, it is possible to clean the wafers W uniformly by removing particles from the wafers W at a high removing efficiency.

Although a particle removing mechanism capable of uniformly removing particles from the wafers W at a high removing efficiency is not clearly known, a mechanism that can be one of factors that can remove particles at a high removing efficiency will be described with reference to FIGS. 4 to 6. However, the present invention is not limited to the mechanism described below.

In ultrasonic cleaning, ultrasonic waves propagated in the cleaning liquid generate pressure variation (pressure vibrations) in the cleaning liquid. Gas molecules contained in the cleaning liquid are ruptured by the pressure vibrations. The rupture of the gas molecules generates shock waves (cavitation). It is inferred that the generation of the shock waves (cavitation) is one of major factors that removes particles from the wafers W. Thus it is expected that the higher the dissolved gas concentration of the cleaning liquid, the higher the intensity of the shock waves generated in regions in which ultrasonic waves are propagated and that the shock waves of a high intensity can remove particles from the wafers W at a high removing efficiency.

When the cleaning liquid is spouted into the cleaning tank 12 through the first supplying members 51 from lower side with respect to the vertical level as shown in FIG. 4, the cleaning liquid having the predetermined dissolved gas concentration is supplied always to the region around lower parts of the surfaces of the wafers W held in the cleaning tank 12. Consequently, shock waves (cavitation) are generated in a high density in the region around the lower parts of the surfaces of the wafers W so as to remove particles from the wafers W at a high removing efficiency.

On the other hand, as mentioned in Japanese Patent Application No. 10-109072, it is thought that a gas dissolved in a cleaning liquid absorbs ultrasonic waves. In addition, gas molecules dissolved in a cleaning liquid gather and produce bubbles in regions where negative pressures are produced by ultrasonic waves. It is thought that this phenomenon is remarkable when the cleaning liquid has a high dissolved gas concentration and those large bubbles have a particularly high ultrasonic wave absorbing effect.

Therefore, the ultrasonic waves are attenuated markedly in the region around the lower parts of the surfaces of the wafers W as shown in FIG. 4. Accordingly, it is possible that the ultrasonic waves are attenuated to a level at which the ultrasonic waves cannot exercise a cleaning effect in the region around the middle parts and the upper parts of the surfaces of the wafers W extending above the lower parts of the same. Consequently, particles cannot be removed efficiently from the middle parts and the upper parts of the surfaces of the wafers W.

Thus particles are removed efficiently from the lower parts of the surfaces of the wafers W in the period between times t1 and t2.

The cleaning liquid having the predetermined dissolved gas concentration is supplied continuously to the region around the middle parts of the surfaces of the wafers W in the period between times t2 and t3. As mentioned above, the cleaning liquid is supplied obliquely upward at a predetermined angle and the cleaning liquid overflows the cleaning tank 12 into the outer tank 15.

When the gas molecules dissolved in the cleaning liquid are caused to gather and to produce bubbles by the variation of pressure in the cleaning liquid contained in the cleaning tank 12, the bubbles grow large and, eventually, rise to the surface of the cleaning liquid. Thus it is expected that the dissolved gas concentration of the cleaning liquid decreases if ultrasonic waves are generated continuously without replenishing the cleaning tank 12 with the cleaning liquid. The production and growth of bubbles are promoted particularly in a lower part of the cleaning liquid contained in the cleaning tank 12 where an intense pressure variation occurs and from which bubbles start moving.

Thus it is thought that since new cleaning liquid is not supplied to the lower region of the cleaning tank 12, the dissolved gas concentration of the cleaning liquid in the lower region of the cleaning tank 12 decreases in the period between times t2 and t3. Consequently, particles cannot be efficiently removed from lower parts of the surfaces of the wafers W, but the ultrasonic waves are not attenuated and can be propagated to a part of the cleaning liquid around the middle part of the surfaces of the wafers W as shown in FIG. 5. Since the cleaning liquid having the predetermined dissolved gas concentration is supplied continuously through the second supplying members 52 to the region around the middle parts of the surfaces of the wafers W, particles can be efficiently removed from the middle parts of the surfaces of the wafers W.

The cleaning liquid supplied to the region around the middle parts of the surfaces of the wafers W has a predetermined dissolved gas concentration. Therefore, ultrasonic waves propagated upward from the bottom of the cleaning tank 12 are attenuated in the region around the middle parts of the surfaces of the wafers W. Consequently, it is possible that particles cannot be effectively removed from upper parts of the surfaces of the wafers W extending above the middle parts of the same.

Thus particles are removed efficiently from the middle parts of the surfaces of the wafers W in the period between times t2 and t3.

In a period between times t3 and t4, the dissolved gas concentration of the cleaning liquid in the regions around the lower parts and the middle parts of the surfaces of the wafers W decreases. Therefore, particles cannot be efficiently removed from the lower parts and the middle parts of the surfaces of the wafers W, and hence the ultrasonic waves can be propagated to a region around upper parts of the surfaces of the wafers W as shown in FIG. 6 without being attenuated. Then, the ultrasonic waves reach the surface of the cleaning liquid, the ultrasonic waves are reflected back into the cleaning tank 12 by the surface of the cleaning liquid, and then the reflected ultrasonic waves spread in the cleaning tank 12. Since the cleaning liquid having the predetermined dissolved gas concentration is supplied continuously through the third supplying members 53 to a region around upper parts of the surfaces of the wafer W, particles can be efficiently removed from the upper parts of the surfaces of the wafers W.

Thus, particles can be efficiently removed from the upper parts of the surfaces of the wafers W in the period between times t3 and t4.

During the ultrasonic cleaning operation of the substrate cleaning system 10 in this embodiment, the position from which the cleaning liquid is spouted into the cleaning tank is changed so as to change parts of the surfaces of the wafers W from which particles can be easily removed. In other words, a region in the cleaning tank 12 toward which the cleaning liquid is supplied is changed so as to remove particles efficiently from parts of the surfaces of the wafers W from which particles could not be satisfactorily removed. Thus, particles can be uniformly removed from the wafers W, and particles can be efficiently from the entire surfaces of the wafers W.

As shown in FIG. 3, the control device 18 provides a signal at time t4 so as to stop the ultrasonic wave generating operation of the ultrasonic generator 30. Thus the step of cleaning the wafers W with the cleaning liquid (the chemical solution) by the ultrasonic cleaning process is terminated.

Subsequently, the wafers W are rinsed so as to rinse off the cleaning liquid (chemical solution) from the wafers W. More concretely, the cleaning liquid is drained from the cleaning tank 12 and the outer tank 15 through the drain pipes 13 and 16. As mentioned above, the cleaning liquid drained through the drain pipes 13 and 16 may be discharged from the substrate cleaning system 10 or may be recovered and used again.

Then, the cleaning liquid (pure water) is supplied through the connecting pipe 44 into the cleaning tank 12 without supplying the chemical elements into the connecting pipe 44 by the first chemical source 76 and the second chemical source 77 of the chemical supply unit 75. Thus, pure water is supplied into the cleaning tank 12. Any of the supplying members 51, 52 and 53 may be used for supplying pure water into the cleaning tank 12.

In this rinsing step of rinsing the wafers W, pure water is supplied continuously after the cleaning tank has been filled up with pure water. Pure water overflows the cleaning tank 12 into the outer tank 15. Thus the wafers W are rinsed with pure water in the rinsing step. Pure water contained in the outer tank 15 may be either discharged from the substrate cleaning system 10 or recovered and used again, depending on the resistivity of the pure water contained in the outer tank 15.

After the wafers W have been rinsed, the wafer boat 20 is moved upward in order to take out the wafers W from the cleaning tank 12. Thus the series of cleaning steps is completed.

According to above embodiment, supplying members used for supplying the cleaning liquid into the cleaning tank 12 are varied in order to change the position from which the cleaning liquid is supplied into the cleaning tank 12 during the ultrasonic cleaning process. As a result of this, a region toward which the cleaning liquid is delivered is changed during the ultrasonic cleaning process. Therefore, the distribution of dissolved gas concentration of the cleaning liquid around the surfaces of the wafers W is changed. Consequently, parts of the surfaces of the wafers W from which particles can be efficiently removed is changed. Thus particles can be uniformly removed from the surfaces of the wafers W and particles can be removed from the entire surfaces of the wafers at a high particle removing efficiently.

The substrate cleaning system 10 has the control device 18 including the computer. The control device 18 controls operations of the components of the substrate cleaning system 10 so as to clean the wafers W. The present invention provides a program to be executed by the computer of the control device 18 so as to accomplish the wafer cleaning process, and a storage medium 19 storing this program. The storage medium 19 may include a flexible disk, a hard disk drive or the like.

Some possible modifications relative to the above embodiment will be described. Some of the following modifications may be used in combination.

(Modification 1)

In the foregoing embodiment, the cleaning liquid is supplied sequentially through the first supplying members 51, the second supplying members 52 and the third supplying members 53 in that order. However, the present invention is not limited thereto. For example, the supplying order of the supplying members 51, 52 and 53 may be reversed.

In the foregoing embodiment, each of the first supplying members 51, the second supplying members 52 and the third supplying members 53 supply the cleaning liquid into the cleaning tank 12 in only one predetermined continuous period. However, not limited thereto, any of the first supplying members 51, the second supplying members 52 and the third supplying members 53 may supply the cleaning liquid into the cleaning tank 12 in two or more periods. For example, a cleaning liquid supplying cycle between the times t1 and t4, shown in FIG. 3, may be repeated twice.

(Modification 2)

In the foregoing embodiment, the substrate cleaning system 10 has the three pairs of supplying members, namely, the pair of first supplying members 51, the pair of second supplying members 52 and the pair of third supplying members 53. However, the structure of supplying member is not limited thereto. The number and the positions of the supplying members are not limited to those specifically described above and the number and arrangement of the supplying members may be determined taking into consideration various conditions including the size of wafers W to be cleaned.

(Modification 3)

Figure 7:
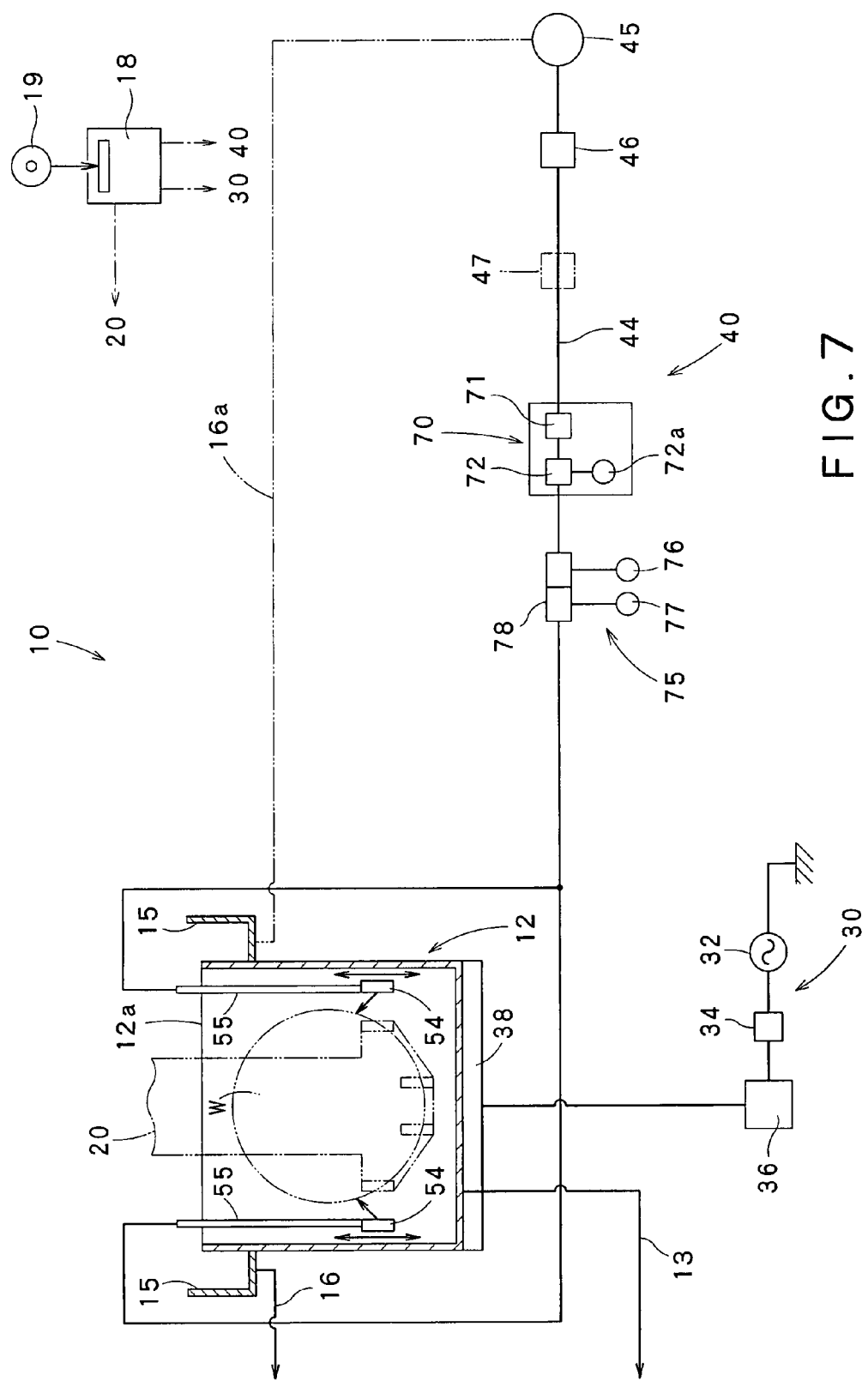
FIG. 7 is a schematic view corresponding to FIG. 1 and showing a modification of the substrate cleaning system.

In the foregoing embodiment, the substrate cleaning system 10 changes the position from which the cleaning liquid is supplied into the cleaning tank 12 with respect to the vertical level. More concretely, supplying members, used for supplying the cleaning liquid into the cleaning tank 12, of the supplying members 51, 52 and 53 is changed in order to change the position with respect to a vertical level from which the cleaning liquid is supplied into the cleaning tank 12 so that a region toward which the cleaning liquid is supplied is changed with respect to the vertical level. However, not limited thereto, directions in which the supplying members 51, 52 and 53 supply the cleaning liquid may be changed in addition to changing the supplying members used for supplying the cleaning liquid. In addition, the supplying members 51, 52 and 53 may be vertically moved. Furthermore, if the directions in which the supplying members 51, 52 and 53 supply the cleaning liquid is changed or if the supplying members 51, 52 and 53 are moved vertically, two or more pairs of supplying members do not need to be disposed at different positions, respectively, with respect to the vertical level. A single supplying member may be used and the direction in which the supplying member supplies the cleaning liquid and the position of the supplying member with respect to the vertical level may be changed so as to supply the cleaning liquid to different regions with respect to the vertical level sequentially. FIG. 7 shows a substrate cleaning system 10 in the modification 3.

In the example shown in FIG. 7, a cleaning liquid supply system 40 included in the substrate cleaning system 10 includes a pair of supplying members 54 disposed on the opposite sides, respectively, of wafers W placed in a cleaning tank 12. Each of the supplying members 54 is supported individually by support member 55. The supplying members supported by the support members 55 are positioned at the same vertical level. The supplying members 54 may be the same in construction as the supplying members 51, 52 and 53 of the foregoing embodiment explained with reference to FIGS. 1 to 3. The support members 55 are connected to a driving mechanism, not shown, controlled by a control device 18. The driving mechanism operates according to a signal provided by the control device 18 so as to move the support members 55 supporting the supplying members 54 vertically. A connecting pipe 44 is connected through the support members 55 to the supplying members 54. The supplying members 54 can supply the cleaning liquid into a cleaning tank 12 while moving vertically. Therefore, the position with respect to a vertical level from which the cleaning liquid is supplied into the cleaning tank 12 can be changed, and thus a region in the cleaning tank 12 toward which the cleaning liquid is supplied can be changed during an ultrasonic cleaning process.

In FIG. 7, parts like or corresponding to those of the substrate cleaning system 10 in the foregoing embodiment and the foregoing modifications shown in FIGS. 1 to 6 are designated by the same reference characters and the description thereof will be omitted to avoid duplication.

For example, in the substrate cleaning system 10 shown in FIG. 7, directions in which the cleaning liquid is supplied through the supplying members 54 may be changed by changing the respective angular positions of the supplying members 54 relative to the support members 55. In this case, it may be possible that the region toward which the cleaning liquid is supplied is changed only by changing the directions in which the cleaning liquid is supplied through the supplying members 54 without moving the support members 55 and the supplying members 54 relative to the cleaning tank 12.

(Modification 4)

In the foregoing embodiment, as shown in FIG. 3, the dissolved gas concentration of the cleaning liquid supplied into the cleaning tank 12 is fixed. However, not limited thereto, the dissolved gas concentration of the cleaning liquid may be varied. The dissolved gas concentration of the cleaning liquid can be changed by changing the inputs to the deaerator 71 and the dissolving device 72 of the dissolved gas concentration adjusting device 70. Such a modification of operation is shown in FIG. 8 by way of example.

Figure 8:
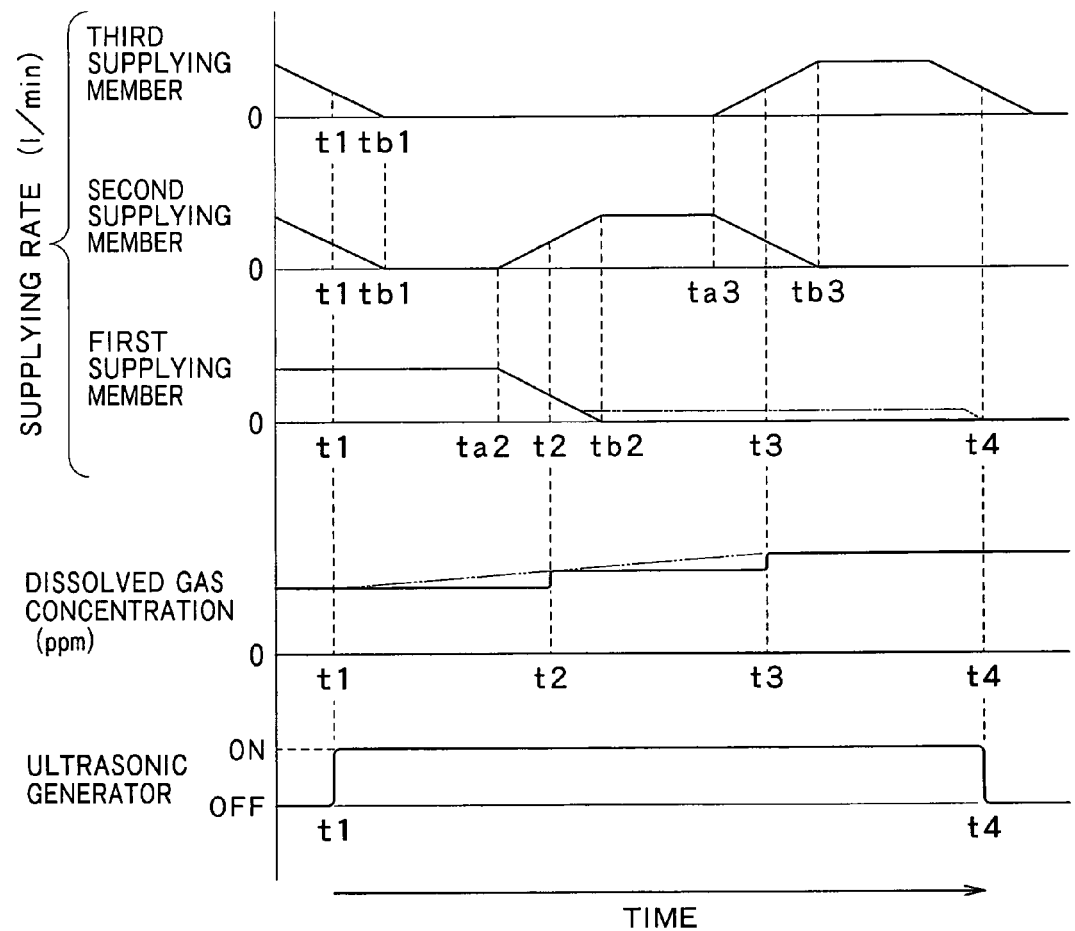
FIG. 8 is a diagram corresponding to FIG. 3 for explaining a modification of the substrate cleaning method.

In the example indicated by continuous lines in FIG. 8, the dissolved gas concentration is changed in a step manner (stepwise). In this case, the dissolved gas concentration of a cleaning liquid supplied through one of the supplying members and the dissolved gas concentration of a cleaning liquid supplied through another one of the supplying members are different. The cleaning liquid having a high dissolved gas concentration is supplied to upper region of the cleaning tank 12 in which ultrasonic waves are attenuated to a certain degree. Therefore, it is expected that the difference in particle removing efficiency between a region around upper parts and a region around lower parts of the surfaces of the wafers W can be reduced still further.

In the example indicated by a two-dot chain line in FIG. 8, the dissolved gas concentration is changed in a stepless manner (continuously). In this case, the dissolved gas concentration of a cleaning liquid supplied through one of the supplying members is varied in a stepless manner, and the dissolved gas concentration of a cleaning liquid supplied through one of the supplying members and the dissolved gas concentration of a cleaning liquid supplied through another one of the supplying members are different. It is expected that particles can be more uniformly removed from the surfaces of the wafers W when the dissolved gas concentration is thus varied continuously.

(Modification 5)

In the foregoing embodiment, the substrate cleaning system 10 includes the dissolved gas concentration adjusting device 70 placed in the connecting pipe 44 connecting the cleaning liquid distributing mechanism 60 to the cleaning liquid source 45. However, the structure of the dissolved gas concentration adjusting device 70 is not limited thereto. A dissolved gas concentration adjusting device may be placed in any one of the supply pipes 41, 42 and 43 or dissolved gas concentration adjusting devices may be placed in all the supply pipes 41, 42 and 43, instead of placing the dissolved gas concentration adjusting device 70 in the connecting pipe 44 or in addition to placing the dissolved gas concentration adjusting device 70 in the connecting pipe 44. Such a substrate cleaning system 10 in the modification 5 is shown in FIG. 9.

Figure 9:
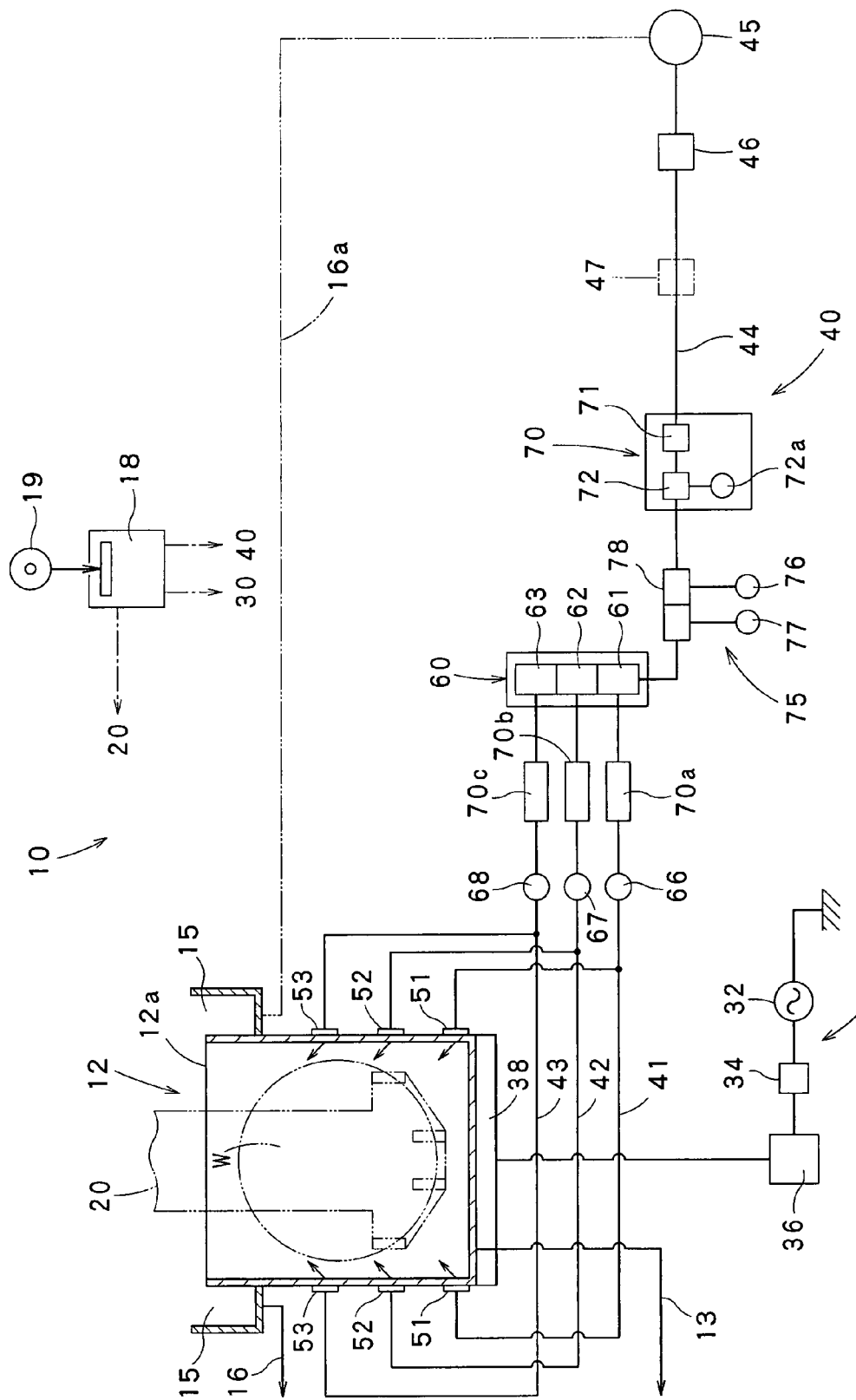
FIG. 9 is a schematic view corresponding to FIG. 1 and showing a modification of the substrate cleaning system.

Referring to FIG. 9, an upstream dissolved gas concentration adjusting device 70 is placed in the connecting pipe 44. A first downstream dissolved gas concentration adjusting device 70a, a second downstream dissolved gas concentration adjusting device 70b and a third downstream dissolved gas concentration adjusting device 70c are placed in a first supply pipe 41, a second supply pipe 42 and a third supply pipe 43, respectively. According to this substrate cleaning system 10, it is possible to adjust the respective dissolved gas concentrations of cleaning liquids supplied through supplying members 51, 52 and 53 individually. Therefore, The cleaning liquids respectively having different dissolved gas concentrations can be simultaneously supplied through the different supplying members 51, 52 and 53. In this case, dissolved gas concentration distribution in a region around the surfaces of wafers W can be varied during an ultrasonic cleaning process without changing supplying members used for supplying the cleaning liquid, even if the cleaning liquids are supplied respectively through the supplying members 51, 52 and 53 at the same supplying rate.

In FIG. 9, parts like or corresponding to those of the substrate cleaning system in the foregoing embodiment and the foregoing modifications shown in FIGS. 1 to 6 are designated by the same reference characters and the description thereof will be omitted to avoid duplication.

In the example shown in FIG. 9, the dissolved gas concentration of the cleaning liquid can be adjusted by the upstream dissolved gas concentration adjusting device 70 and hence any one of the downstream dissolved gas concentration adjusting devices 70*a*, 70*b* and 70*c* may be omitted. Although there is not any particular restriction on the construction of the downstream dissolved gas concentration adjusting devices 70*a*, 70*b* and 70*c*, each of those downstream dissolved gas concentration adjusting devices 70*a*, 70*b* and 70*c* may be formed by properly combining the deaerator 71 and the dissolving device 72 described above. For example, in the substrate cleaning system 10 shown in FIG. 9, the upstream dissolved gas concentration adjusting device 70 may include only a deaerator 71, and each of the downstream dissolved gas concentration adjusting devices 70*a*, 70*b* and 70*c* may include only a dissolving device 72.

(Modification 6)

In the foregoing embodiment, the cleaning liquid is supplied at a fixed cleaning liquid supplying rate into the cleaning tank 12 as shown in FIG. 3. However, not limited thereto, the supplying rate may be varied. When the cleaning liquid deliver device 46 is used, the supplying rate at which the cleaning liquid is supplied through the supplying members 51, 52 and 53 into the cleaning tank 12 can be adjusted as a whole by adjusting the discharge of the cleaning liquid deliver device 46. The supplying rates at which the cleaning liquid is supplied through any one of the supplying members 51, 52 and 53 can be individually adjusted by using the flow adjusting mechanisms 66, 67 and 68. Such a modification of operation is shown in FIG. 8 by way of example.

In the example indicated by continuous lines in FIG. 8, when the supplying members 51, 52 and 53 start and stop to supply the cleaning liquid, cleaning liquid supplying rates at which the supplying members 51, 52 and 53 supply the cleaning liquid, respectively, vary gradually and continuously. In a period in the ultrasonic cleaning process, the two or all of the supplying members 51, 52 and 53 supply the cleaning liquid simultaneously. In a period in the ultrasonic cleaning process, the cleaning liquid supplying rate at which one of the supplying members 51, 52 and 53 supplies the cleaning liquid is varied, and the cleaning liquid supplying rates at which one of the supplying members 51, 52 and 53 supplies the cleaning liquid and the cleaning liquid supplying rates at which another one of the supplying members 51, 52 and 53 supplies the cleaning liquid are different.

When the substrate cleaning system 10 operates in such a mode of operation, the supplying rate does not change sharply at the start and the termination of supplying the cleaning liquid. Therefore, it is easy to avoid troubles resulting from the vibration of the wafer W caused by the spouted cleaning liquid.

In this case, as shown in FIG. 8, the cleaning liquid supplying rate at which the cleaning liquid is supplied through the first supplying members 51 decreases gradually in a stepless manner, while the cleaning liquid supplying rate at which the cleaning liquid is supplied through the second supplying members 52 increases gradually in a stepless manner in a period between times ta2 and tb2. Thus the region in the cleaning tank 12 toward which the cleaning liquid is supplied can be smoothly changed in the period between times ta2 and tb2. Similarly, the cleaning liquid supplying rate at which the cleaning liquid is supplied through the second supplying members 52 decreases gradually in a stepless manner, while the cleaning liquid supplying rate at which the cleaning liquid is supplied through the third supplying members 53 increases gradually in a stepless manner in a period between times ta3 and tb3 shown in FIG. 8. Consequently, the region in the cleaning tank 12 toward which the cleaning liquid is supplied can be smoothly changed. Thus it is expected that particles can be more uniformly removed from the surfaces of the wafers W.

Furthermore, the cleaning liquid supplying rate at which the cleaning liquid is supplied through the third supplying members 53 may be higher than the cleaning liquid supplying rate at which the cleaning liquid is supplied through the second supplying members 52, and the cleaning liquid supplying rate at which the cleaning liquid is supplied through the second supplying members 52 may be higher than the cleaning liquid supplying rate at which the cleaning liquid is supplied through the first supplying members 51. When the cleaning liquid is thus supplied into the cleaning tank 12, the cleaning liquid is supplied at a high supplying rate into a region around upper parts of the surfaces of the wafers W in which the ultrasonic waves are attenuated inevitably to a certain degree. Thus the difference among particle removing efficiencies at which particles are removed from the upper parts of the surfaces of the wafers W, the middle parts of the surfaces of the wafers W and the lower parts of the surfaces of the wafers W can be reduced still further.

In another example, the cleaning liquid may be continuously supplied through the first supplying members 51 disposed at the lower position. As indicated by a two-dot chain line in FIG. 8, the first supplying members 51 may continue supplying the cleaning liquid even after time t2. In this example, all the supplying members 51, 52 and 53 supply the cleaning liquid simultaneously at different supplying rates, respectively, into the cleaning tank 12 in a period between times ta3 and tb3.

When the first supplying members 51 disposed at the lower position supply the cleaning liquid continuously, upward currents (upflow) of the cleaning liquid are generated in the cleaning tank 12. Consequently, particles removed from the wafers W are carried to the surface of the cleaning liquid contained in the cleaning tank 12 and the overflow of the particles together with the cleaning liquid from the cleaning tank 12 into the outer tank 15 can be promoted. Thus the particles removed from the wafers W can be prevented from adhering again to the wafers W.

(Modification 7)

In the foregoing embodiment, the first flow adjusting mechanism 66 is placed in the first supply pipe 41 connecting the cleaning liquid distributing mechanism 60 to the first supplying members 51, the second flow adjusting mechanism 66 is placed in the second supply pipe 42 connecting the cleaning liquid distributing mechanism 60 to the second supplying members 52, and the third flow adjusting mechanism 68 is placed in the third supply pipe 43 connecting the cleaning liquid distributing mechanism 60 to the third supplying members 53 to regulate the flow rates of the cleaning liquid respectively in the supply pipes 41, 42 and 43 individually. However, the structure of the adjusting mechanism is not limited thereto. For example, since the cleaning liquid supplying rate can be adjusted by adjusting the discharge of the cleaning liquid deliver device 46, one of the flow adjusting mechanism may be omitted. If the supplying rates at which the cleaning liquid is supplied respectively by the supplying members 51, 52 and 53 do not need to be different from each other as shown in FIG. 3, all the flow adjusting mechanisms 66, 67 and 68 may be omitted.

(Modification 8)

In the foregoing embodiment, during the ultrasonic cleaning process, the cleaning liquid is supplied into the cleaning tank continuously through any of the supplying members 51, 52 and 53 of the substrate cleaning system 10, that is to say, the ultrasonic cleaning process consist of only the step of generating ultrasonic waves in the cleaning liquid contained in the cleaning tank 12 while generating ultrasonic waves in the cleaning liquid contained in the cleaning tank 12 while the cleaning liquid is being supplied into the cleaning tank 12. However, not limited thereto, the ultrasonic cleaning process may include the step of generating ultrasonic waves in the cleaning liquid contained in the cleaning tank 12 while the supply of the cleaning liquid into the cleaning tank 12 is stopped in addition to the step of generating ultrasonic waves in the cleaning liquid contained in the cleaning tank 12 while the cleaning liquid is being supplied into the cleaning tank 12.

(Modification 9)

In the foregoing embodiment, SC1 is used as the cleaning liquid for the ultrasonic cleaning of the wafers W. However, not limited thereto, the wafers W may be cleaned by the ultrasonic cleaning process using a chemical solution other than SC1. For example, the cleaning liquid may be pure water. When the wafers W are cleaned by the ultrasonic cleaning process using pure water as the cleaning liquid, the rinsing process may be omitted.

(Modification 10)

In the foregoing embodiment, the ultrasonic generator 30 is stopped during the rinsing process for rinsing off the chemical solution with pure water, namely, a rinsing liquid, not to generate ultrasonic waves in the pure water. However, a rinsing effect of the rinsing process may be enhanced and particles still remaining on the wafers W may be removed by generating ultrasonic waves in the rinsing liquid (pure water) contained in the cleaning tank 12 by the ultrasonic generator 30 during the rinsing process. Thus the wafers W can be cleaned by ultrasonic cleaning using pure water by a method similar to the ultrasonic cleaning method using the chemical solution.

(Modification 11)

As mentioned in Japanese Patent Application No. 2005-296868, bubbles of the gas contained in the cleaning liquid contained in the cleaning tank 12 are effective in removing particles (dirt) from the wafers W. Bubbles can be regarded as agglomerations of gas molecules. Pressure variation in the cleaning liquid causes gas molecules agglomerated in bubbles so as to generate intense shock waves (cavitation). In addition, as mentioned above, bubbles, similarly to gas molecules, absorb ultrasonic waves propagated in the cleaning liquid. The higher the degree of agglomeration of gas molecules, the more conspicuous is this phenomenon. Thus bubbles contained in the cleaning solution have the same effect as the gas dissolved in the cleaning liquid during the ultrasonic cleaning process.

In the foregoing embodiment, the cleaning liquid containing the dissolved gas is supplied into the cleaning tank 12. However, not limited thereto, the cleaning liquid supplied into the cleaning tank 12 may contain bubbles of the gas. Such a modification will be described with reference to FIGS. 10 and 11.

In those modifications, the dissolved gas concentration of the cleaning liquid may be either of 0 ppm and a predetermined value.

(Modification 11-1)

Figure 10:
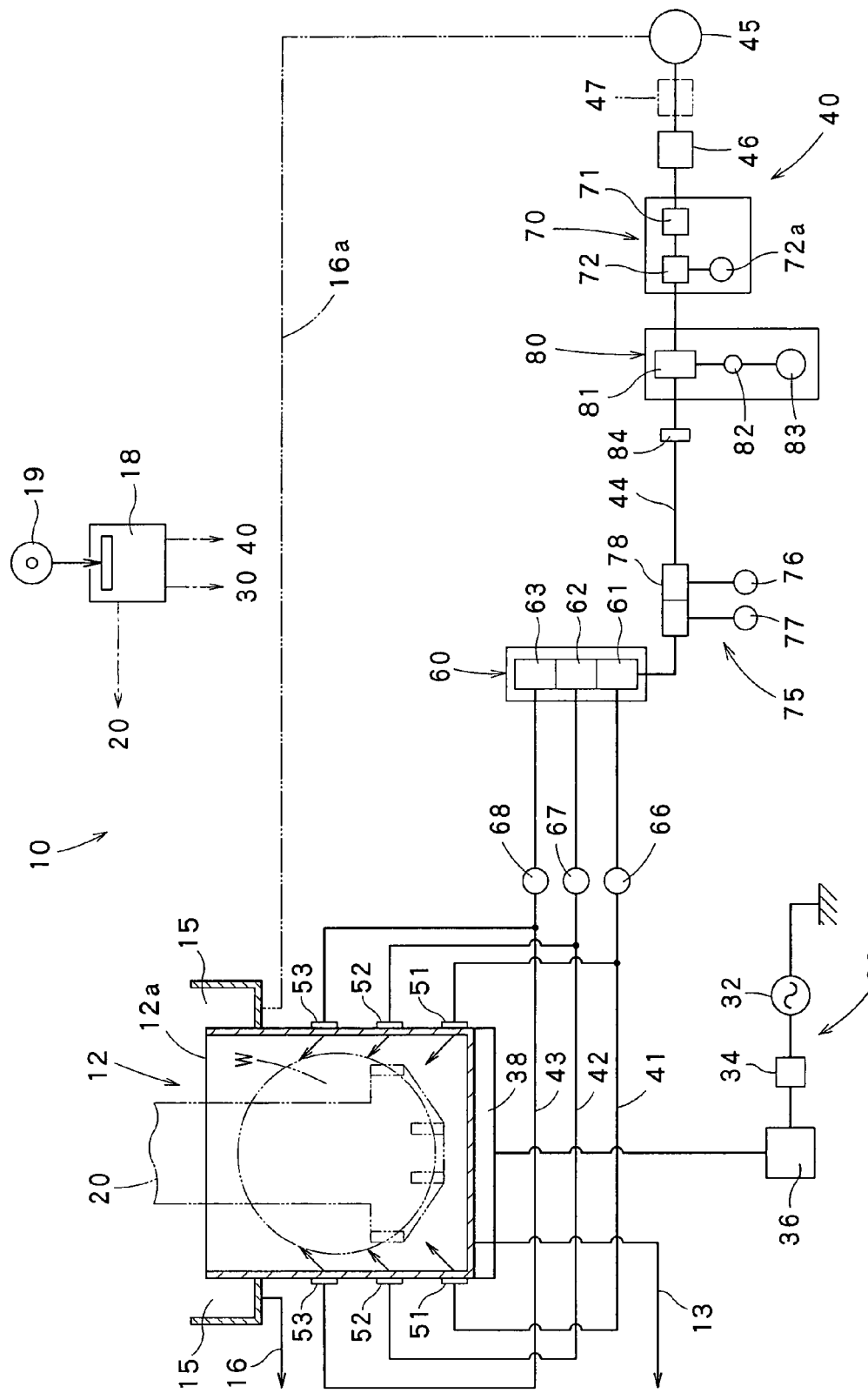
FIG. 10 is a schematic view corresponding to FIG. 1 and showing a modification of the substrate cleaning system.

A substrate cleaning system 10 shown in FIG. 10 includes a bubble forming unit 80 connected to the connecting pipe 44 connecting a cleaning liquid source 45 to a cleaning liquid distributing mechanism 60 so as to form bubbles in a cleaning liquid flowing through the connecting pipe 44. The bubble forming unit 80 has: a gas discharging member (bubble supplying member) 81 connected to the connecting pipe 44 so as to discharge a gas into the connecting pipe 44; a gas source 83 storing the gas; and a gas deliver device 82 for delivering the gas stored in the gas source 83 to the gas discharging member 81. A control device 18 is connected to the bubble forming unit 80 so as to control operations of the bubble forming unit 80. The bubble forming unit 80 supplies the gas through the gas discharging member 81 into a cleaning tank 12 at a gas supplying rate (bubble supplying rate) (l/min) on the basis of a signal provided by the control device 18.

The gas deliver device 82 may be a known mechanism or device, such as a compressor. The gas stored in the gas source 83 may be air or an inert gas, preferably nitrogen gas. The gas discharging member 81 may be, for example, a nozzle provided with many small pores, namely, an elongate tubular member provided with may pores. The gas discharging member 81 is placed in the connecting pipe 44. The gas supplied at a predetermined gas supplying rate by the gas deliver device 82 to the gas discharging member 81 is discharged through the pores into the connecting pipe 44 so that the gas are divided into small bubbles. In this manner, small bubbles formed of the gas are produced in the cleaning liquid flowing through the connecting pipe 44. A known bubbler may be used as the combination of the gas discharging member 81 and the gas deliver device 82.

When wafers W are cleaned by using this substrate cleaning system 10, the supplying members 51, 52 and 53 for supplying the cleaning liquid into a cleaning tank 12 are used selectively in a mode as mentioned above in connection with FIG. 3 during an ultrasonic cleaning process. Thus the position from which the cleaning liquid is supplied into the cleaning tank 12 is varied and the region in the cleaning tank 12 toward which the cleaning liquid is varied. Consequently, bubble density distribution in the cleaning liquid in a region around the surfaces of the wafers W varies during an ultrasonic cleaning process. When bubble density distribution in the region around the surfaces of the wafers W is thus varied, parts of the surfaces of the wafers W from which particles can be efficiently removed varies. Consequently, particles can be uniformly removed from the wafers W at a high removing efficiency.

It is thought that although large bubbles do not contribute to removing particles the large bubbles attenuate ultrasonic waves propagated in the cleaning liquid significantly during the ultrasonic cleaning process. The substrate cleaning system 10 shown in FIG. 10 includes a filter 84 placed at a position in the connecting pipe 44 on the downstream side of the bubble forming unit 80. As the cleaning liquid containing bubbles formed therein by the bubble forming unit 80 flows through the filter 84, large bubbles are arrested and are divided into smaller bubbles by the filter 84. Thus the cleaning liquid containing only small bubbles is supplied into the cleaning tank 12.

Bubbles may be supplied through the supplying members 51, 52 and 53 at a fixed bubble supplying rate during the ultrasonic cleaning process or the bubble supplying rate may be varied by a method similar to that of varying the dissolved gas concentration of the cleaning liquid mentioned in connection with the description of the modification 4. In addition, when the bubbles are simultaneously supplied through at least two of the supplying members 51, 52 and 53 into the cleaning tank 12, the bubble supplying rate at which the bubbles are supplied through one of supplying members and the bubble supplying rate at which the bubbles are supplied through another one of the supplying members 51, 52 and 53 disposed at a position different from a position at which the former supplying member is disposed with respect to the vertical level may be different. The bubble supplying rate may be determined by the volume of the gas supplied in a unit time by the gas deliver device 82.

It is inferred that the degree of ultrasonic wave absorption by the bubbles and the degree of the cleaning effect of the bubbles can be dependent on the size of the bubbles. Therefore, the substrate cleaning system 10 may be controlled on the basis of the number of bubbles supplied in a unit time by the gas deliver device 82. More specifically, the bubble forming unit 80 may be controlled such that the number of bubbles supplied in a unit time through the supplying members 51, 52 and 53 is fixed or varied during the ultrasonic cleaning process for cleaning the wafers W. In addition, when the bubbles are simultaneously supplied through at least two of the supplying members 51, 52 and 53 into the cleaning tank 12, the number of bubbles supplied in a unit time through one of the supplying members 51, 52 and 53, and the number of bubbles supplied in a unit time through another one of the supplying members 51, 52 and 53 disposed at a position different from a position at which the former supplying member is disposed with respect to the vertical level may be different. The number of bubbles can be counted by a liquid-contained particle counter, such as "Analyzer Model 3610" available from Orbisphere Laboratories.

In FIG. 10, parts like or corresponding to those of the substrate cleaning system 10 in the foregoing embodiment and the foregoing modifications shown in FIGS. 1 to 9 are designated by the same reference characters and the description thereof will be omitted to avoid duplication.

(Modification 11-2)

Figure 11:
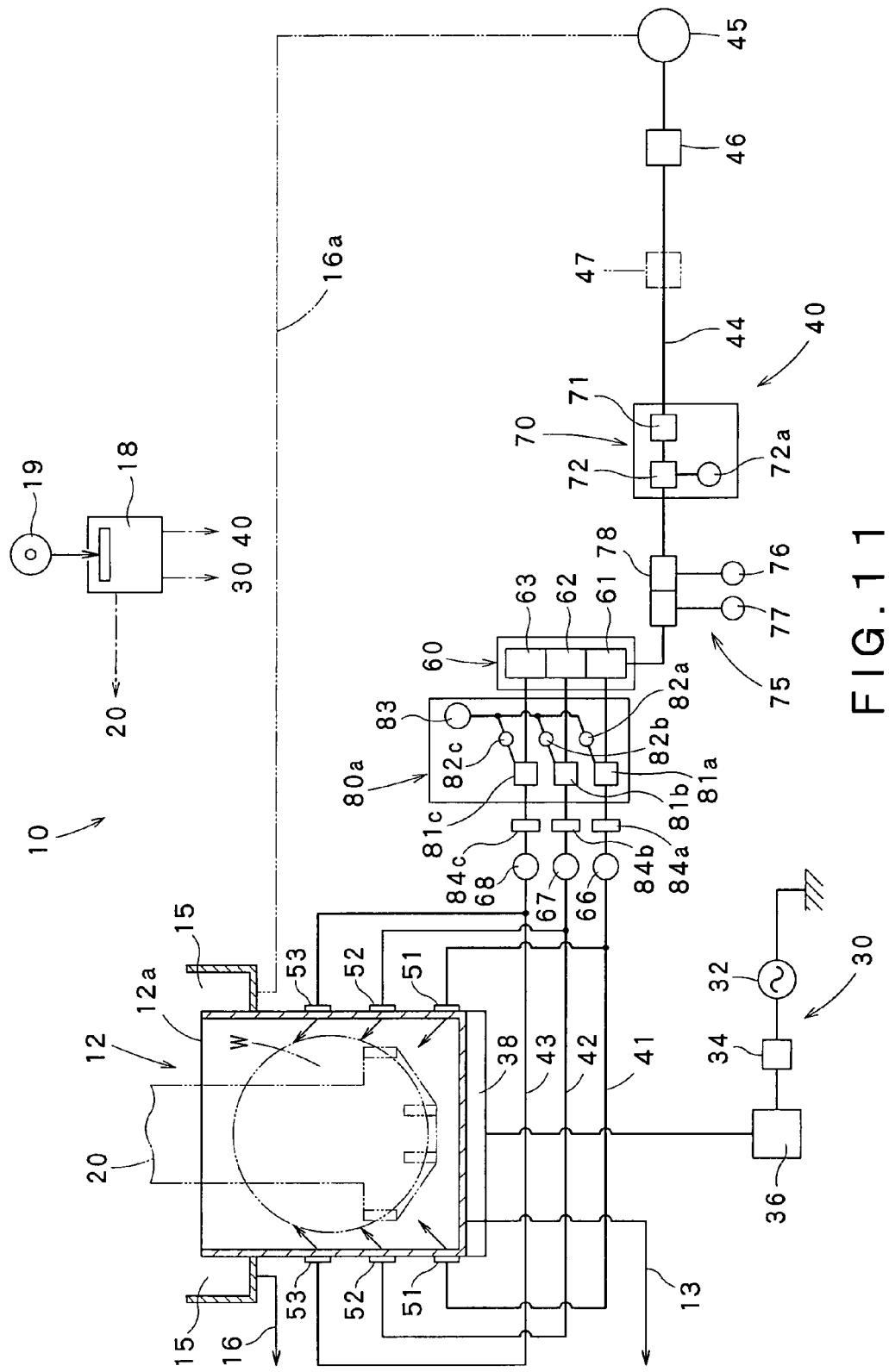
FIG. 11 is a schematic view corresponding to FIG. 1 and showing a modification of the substrate cleaning system.

In an example shown in the FIG. 11, a substrate cleaning system 10 includes the supplying members 51, 52 and 53, the cleaning liquid distributing mechanism 60, and a bubble forming unit 80a placed in supply pipes 41, 42 and 43 respectively connecting the cleaning liquid distributing unit 60 to the supplying members 51, 52 and 53. The bubble forming unit 80a includes: a first gas discharging member 81a placed in a first supply pipe 41 connecting the cleaning liquid distributing mechanism 60 and the first supplying member 51; a second gas discharging member 81b placed in a second supply pipe 42 connecting the cleaning liquid distributing mechanism 60 and the second supplying member 52; and a third gas discharging member 81c placed in a third supply pipe 43 connecting the cleaning liquid distributing mechanism 60 and the third supplying member 53. A first gas deliver device 82a is connected to the first gas discharging member 81a, a second gas deliver device 82b is connected to the second gas discharging member 81b, and a third gas deliver device 82c is connected to the third gas discharging member 81c. The gas deliver devices 82a, 82b and 82c are connected to a gas source 83. A first filter 84a is placed in the first supply pipe 41, a second filter 84b is placed in the second supply pipe 42, and a third filter 84c is placed in the third supply pipe 43, respectively, on the downstream side of the bubble forming unit 80a, namely, on the side of the cleaning tank 12.

The gas discharging members 81a, 81b and 81c may be similar to the gas discharging member 81 of the modification 11-1. The gas deliver devices 82a, 82b and 82c may be similar to the gas deliver device 82 of the modification 11-1. The filters 84a, 84b and 84c may be similar to the filter 84 of the modification 11-1.

According to this substrate cleaning system 10 it may be possible to adjust individually bubble supplying rates at which the bubbles are supplied in the cleaning liquid and the numbers of bubbles supplied in a unit time in the cleaning liquid by controlling supply of the gas through the gas discharging members 81a, 81b and 81c into the cleaning liquid. Thus the cleaning liquids respectively having different bubble densities can be simultaneously supplied through the different supplying members into the cleaning tank 12.

In FIG. 11, parts like or corresponding to those of the substrate cleaning system 10 in the foregoing embodiment and the foregoing modifications shown in FIGS. 1 to 10 are designated by the same reference characters and the description thereof will be omitted to avoid duplication.

(Modification 12)

In the modification 11, the bubbles are formed in the cleaning liquid to be supplied into the cleaning tank 12 and are supplied together with the cleaning liquid into the cleaning tank 12. However, not limited thereto, the bubbles and the cleaning liquid may be supplied separately into the cleaning tank 12. Bubble density distribution in a region around the surfaces of the wafers W can be varied if a region into the cleaning tank 12 toward which the bubbles are supplied with respect to the vertical level by, for example, changing a position with respect to the vertical level from which the bubbles are supplied into the cleaning tank 12. Parts of the wafers W from which particles can be efficiently removed varies if the bubble density distribution in a region around the surfaces of the wafers W varies during an ultrasonic cleaning process. Thus particles can be more uniformly removed from the wafers W and particles can be removed efficiently from the wafers W. Substrate cleaning systems 10 in modifications having such functions will be described with reference to FIGS. 12 to 14.

(Modification 12-1)

A substrate cleaning system 10 in a modification 12-1 will be described with reference to FIGS. 12 and 13, in which parts like or corresponding to those of the substrate cleaning system 10 in the foregoing embodiment and the foregoing modifications shown in FIGS. 1 to 11 are designated by the same reference characters and the description thereof will be omitted to avoid duplication.

Figure 12:
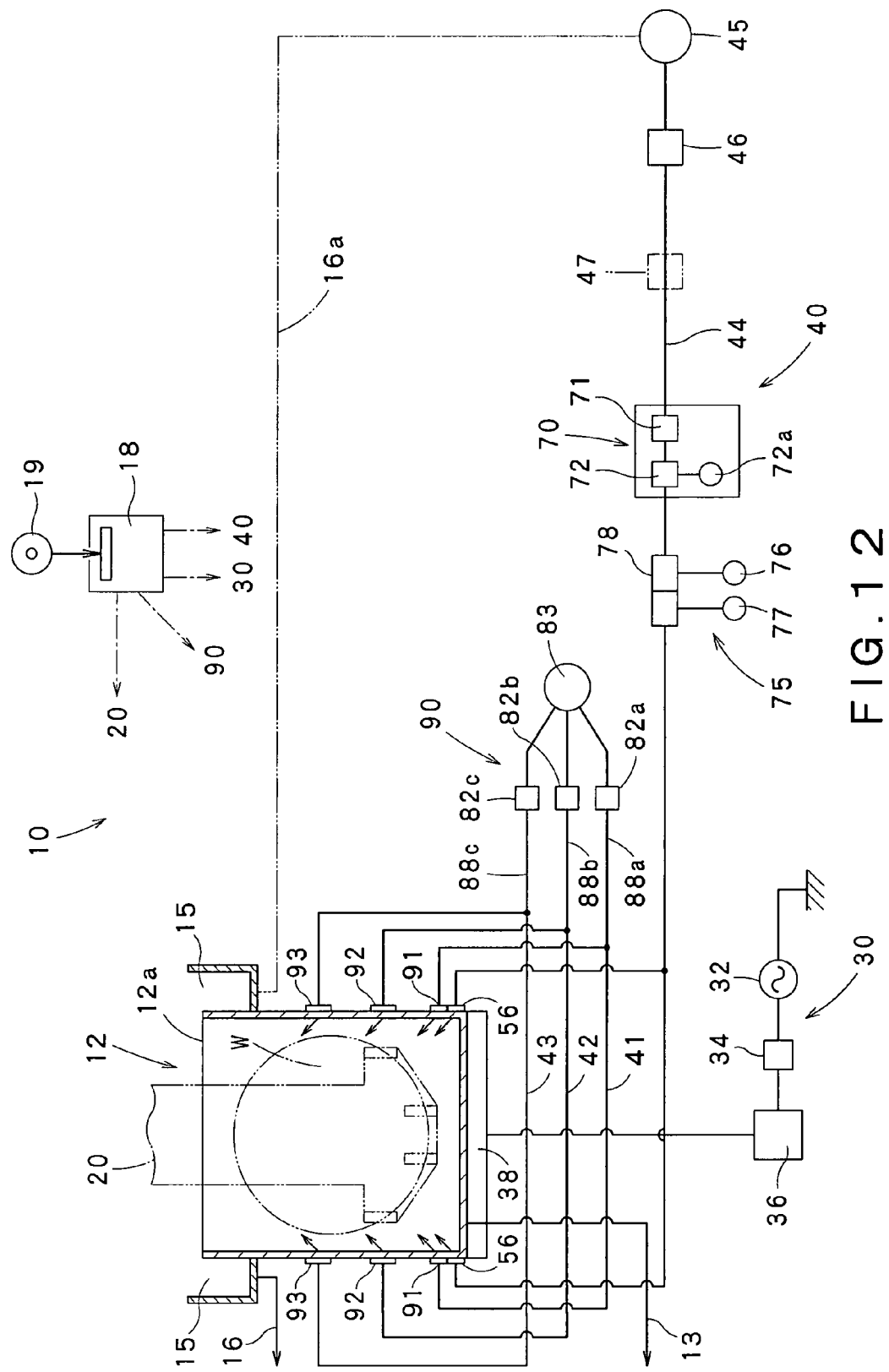
FIG. 12 is a schematic view corresponding to FIG. 1 and showing a modification of the substrate cleaning system.

Referring to FIG. 12, the substrate cleaning system 10 includes the cleaning tank 12, and a bubble forming unit 90 for forming bubbles in a cleaning liquid contained in the cleaning tank 12 by supplying a gas into a cleaning liquid contained in the cleaning tank 12. The bubble forming unit 90 includes: first bubble supplying members (gas supplying members) 91, second bubble supplying members 92 and third bubble supplying members 93 attached to the cleaning tank 12 so as to supply a gas into a cleaning liquid contained in the cleaning tank 12; a gas source 83 storing the gas; and gas deliver devices 82a, 82b and 82c for sending the gas stored in the gas source 83 to the bubble supplying members 91, 92 and 93, respectively. The bubble supplying members 91, 92 and 93 are attached to parts of the side wall of the cleaning tank 12 at three different positions with respect to the vertical level, respectively.

The gas deliver devices 82a, 82b and 82c may be known mechanisms or devices, such as compressors. The gas stored in the gas source 83 may be air, preferably an inert gas, more preferably nitrogen gas. The bubble supplying members 91, 92 and 93 may be nozzles (spouting members) disposed in the cleaning tank 12. For example, the nozzles are made of elongate tubular members provided with small pores. That is to say, the bubble supplying members 91, 92 and 93 may be similar to the supplying members 51, 52 and 53 described in the foregoing embodiment with reference to the FIGS. 1 to 6, respectively, in particular, the supplying members 51, 52 and 53 provided with small pores smaller than the small pores 51a, 52a and 53a. The combination of the bubble supplying members 91, 92 and 93, and the gas deliver devices 82a, 82b and 82c may be a known bubbler.

In the bubble forming unit 90, the gas supplied at predetermined flow rates (bubble supplying rate) by the gas deliver devices 82a, 82b and 83c are supplied through the pores of the bubble supplying members 91, 92 and 93 into the cleaning liquid contained in the cleaning tank 12. While flowing through the pores of the bubble supplying members 91, 92 and 93, the gas are divided into small bubbles so that the small bubbles are supplied into the cleaning tank 12.

As shown in FIG. 12, the supply pipes 88*a*, 88*b* and 88*c* extending from the gas source 83 are connected to the bubble supplying members 91, 92 and 93, respectively. The first bubble supplying members 91, the second bubble supplying members 92 and the third bubble supplying members 93 are attached to parts of the side wall of the cleaning tank 12 at a lower position, a middle position and an upper position with respect to the vertical level, respectively. Thus the gas is supplied into the cleaning liquid contained in the cleaning tank 12 through the first bubble supplying member 91, the second bubble supplying member 92 and the third bubble supplying member 9 from positions at the lower position, the middle position and the upper position, respectively, so as to form bubbles in the cleaning liquid contained in the cleaning tank 12. As shown in FIG. 12, bubbles formed by making the gas flow through the first bubble supplying members 91 are supplied mainly into a lower region around lower parts of the surfaces of the wafers W immersed in the cleaning liquid contained in the cleaning tank 12. As shown in FIG. 12, bubbles formed by making the gas flow through the second bubble supplying members 92 are supplied mainly into a middle region around middle parts of the surfaces of the wafers W immersed in the cleaning liquid contained in the cleaning tank 12. As shown in FIG. 12, bubbles formed by making the gas flow through the third bubble supplying members 93 are supplied mainly into a upper region around upper parts of the surfaces of the wafers W immersed in the cleaning liquid contained in the cleaning tank 12.

A control device 18 is connected to the bubble forming unit 90 so as to control operations of the bubble forming unit 90. The bubble forming unit 90 can supply the bubbles in the cleaning liquid contained in the cleaning tank 12 at a predetermined bubble supplying rate or at a predetermined number of bubbles per unit time by making the gas flow at the predetermined supplying rate (l/min) through the bubble supplying members 91, 92 and 93. The gas deliver devices 82*a*, 82*b* and 82*c* may be individually controlled so as to vary the amounts or numbers of bubbles formed by the gas supplied through the bubble supplying members 91, 92 and 93 individually by individually varying supplying rates at which the gas is supplied through the bubble supplying members 91, 92 and 93, respectively.

A cleaning liquid supply system 40 included in the substrate cleaning system 10 shown in FIG. 12 has supplying members 56 for supplying the cleaning liquid into the cleaning tank 12 from positions on the side wall of the cleaning tank near the bottom of the cleaning tank 12. A supply pipe 44 is connected directly to the supplying members 56. The supplying members 56 may be the same in construction as the supplying members 51, 52 and 53 of the substrate cleaning system 10 described with reference to FIGS. 1 to 6.

Figure 13:
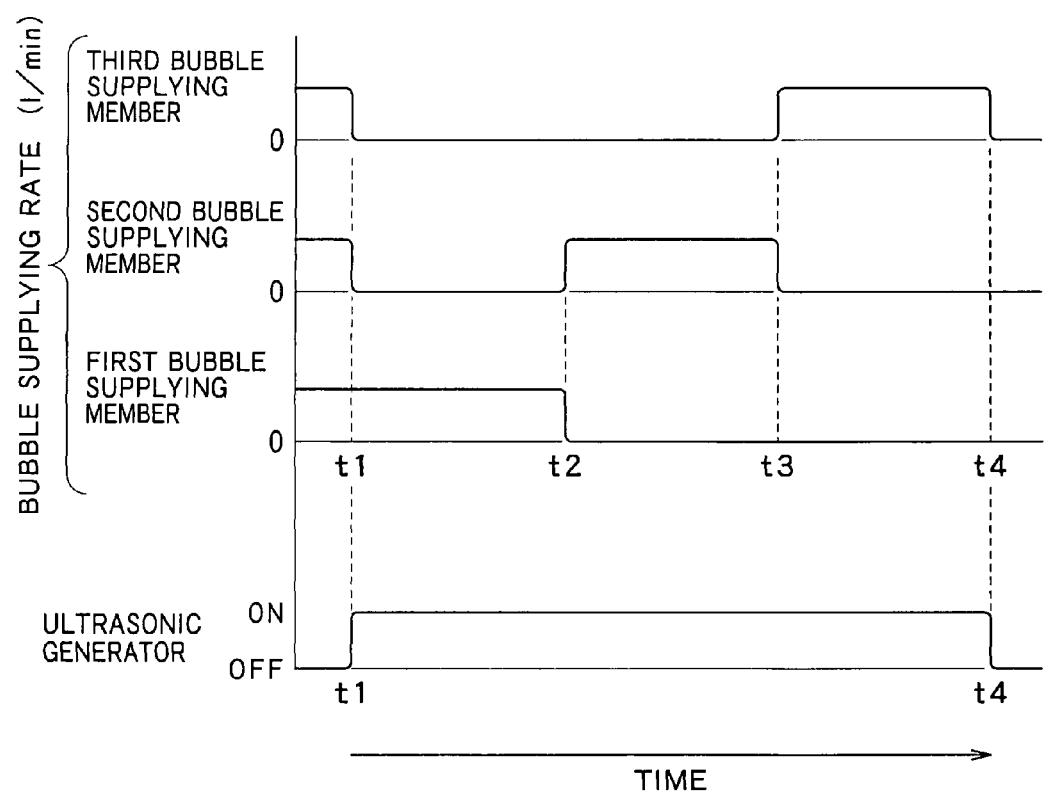
FIG. 13 is a diagram corresponding to FIG. 3 for explaining a modification of the substrate cleaning method

Wafers W can be cleaned by a substrate cleaning method shown in FIG. 13 by using the substrate cleaning system 10 shown in FIG. 12. A bubble supplying members, used for supplying the gas into the cleaning liquid contained in the cleaning tank 12, of the bubble supplying members 91, 92 and 93 can be changed during a cleaning process. The substrate cleaning method shown in FIG. 13 makes the first bubble supplying members 91 disposed at the lower level in the cleaning tank 12 supply the gas into the cleaning liquid contained in the cleaning tank 12 so as to form bubbles in a region around the lower parts of the surfaces of the wafers W in a period between times t1 and t2. The substrate cleaning method makes the second bubble supplying members 92 disposed at the middle level in the cleaning tank 12 supply the gas into the cleaning liquid contained in the cleaning tank 12 so as to form bubbles in a region around the middle parts of the surfaces of the wafers W in a period between times t2 and t3. Then, the substrate cleaning method makes the third bubble supplying members 93 disposed at the upper position supply the gas into the cleaning liquid contained in the cleaning tank 12 so as to form bubbles in a region around the upper parts of the surfaces of the wafers W in a period between times t3 and t4.

The cleaning tank 12 may be replenished or not replenished with the cleaning liquid by the cleaning liquid supply system 40 during an ultrasonic cleaning process. When the cleaning liquid supply system 40 replenishes the cleaning tank 12 with the cleaning liquid, the cleaning liquid is supplied through the supplying members 56 obliquely upward as shown in FIG. 12 into spaces separating the adjacent wafers W in a mode similar to that mentioned in the description of the substrate cleaning system 10 in connection with FIGS. 1 to 6. As the cleaning liquid is supplied continuously through the supplying members 56, the cleaning liquid overflows the cleaning tank 12 into an outer tank 15. The thus recovered cleaning liquid may be discharged from the substrate cleaning system 10 or may be returned through a circulation pipe 16*a* into a cleaning liquid source 45 so as to use the cleaning liquid again.

In this substrate cleaning method, a bubble supplying member, used for supplying the bubbles into the cleaning tank 12, of the bubble supplying members 91, 92 and 93 are changed so that a region in the cleaning tank 12 toward which the bubbles are spouted is changed. Consequently, bubble density distribution in the cleaning liquid in a region around the surfaces of the wafers W varies. When bubble density distribution in the region around the surfaces of the wafers W is thus varied, parts of the surfaces of the wafers W from which particles can be efficiently removed varies. Consequently, particles can be uniformly removed from the wafers W at a high removing efficiency.

A gas supplying method shown in FIG. 13 is only an example and the gas may be supplied into the cleaning liquid in any one of other suitable methods. The method of supplying the gas through the bubble supplying members 91, 92 and 93 may be properly changed similarly to the method of supplying the cleaning liquid through the supplying members 51, 52 and 53 of the substrate cleaning system 10 in the foregoing embodiment and the foregoing modifications. For example, a bubble supplying rate (l/min) at which the gas is supplied through one of the bubble supplying members so as to form the bubbles may be varied. In addition, the number of bubbles (n bubbles/min) at which bubbles are supplied into the cleaning tank 12 through one of the bubble supplying members may be varied. The two pairs of the bubble supplying members may be simultaneously used for supplying the gas as bubbles into the cleaning tank 12. The bubbles may be simultaneously supplied through at least two of the bubble supplying members 91, 92 and 93 into the cleaning tank 12. In addition, when the bubbles are simultaneously supplied through at least two of the bubble supplying members 91, 92 and 93 into the cleaning tank 12, the bubble supplying rate at which the bubbles are supplied through one of bubble supplying members and the bubble supplying rate at which the bubbles are supplied through another one of the bubble supplying members 91, 92 and 93 disposed at a position different from a position at which the former bubble supplying member is disposed with respect to the vertical level may be different.

Furthermore, when the bubbles are simultaneously supplied through at least two of the bubble supplying members 91, 92 and 93 into the cleaning tank 12, the number of bubbles supplied in a unit time through one of the bubble supplying members 91, 92 and 93, and the number of bubbles supplied in a unit time through another one of the bubble supplying members 91, 92 and 93 disposed at a position different from a position at which the former bubble supplying member is disposed with respect to the vertical level may be different.

(Modification 12-2)

Figure 14:
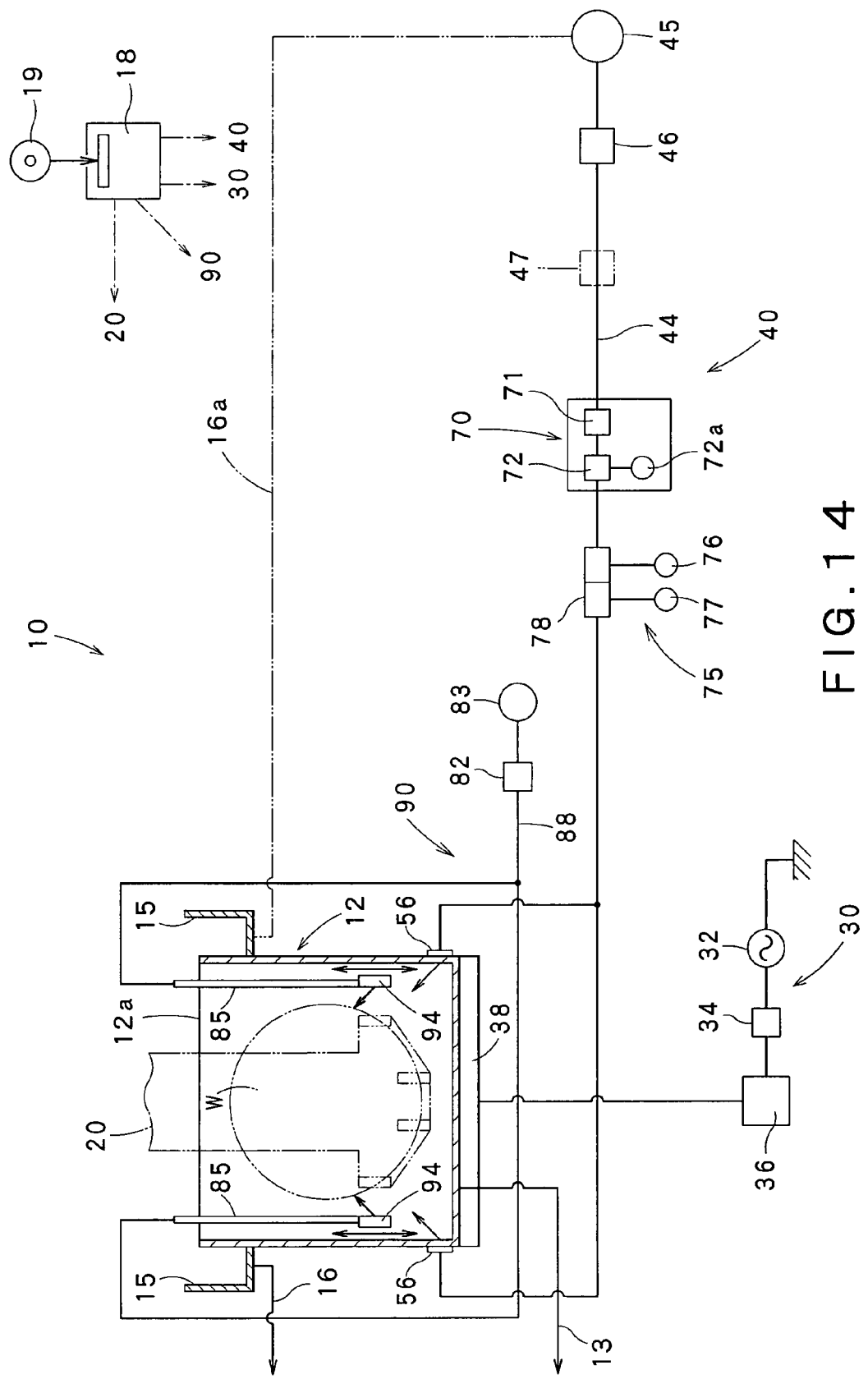
FIG. 14 is a schematic view corresponding to FIG. 1 and showing a modification of the substrate cleaning system.

A modification 12-2 will be described with reference to FIG. 14. In FIG. 14, parts like or corresponding to those of the substrate cleaning system 10 in the foregoing embodiment and the foregoing modifications shown in FIGS. 1 to 13 are designated by the same reference characters and the description thereof will be omitted to avoid duplication.

The substrate cleaning system 10 in the modification 12-1 can select the position from which the gas for forming bubbles is supplied into the cleaning tank 12 with respect to the vertical level; that is to say, the bubble supplying members 91, 92 and 93 disposed respectively at the different positions with respect to the vertical level are used selectively and alternatively so as to change the position from which the gas for forming bubbles is supplied into the cleaning tank 12 so that a region in the tank toward which the bubbles are supplied is varied with respect to the vertical level. However, the method of changing a region in the tank toward which the bubbles are supplied with respect to the vertical level is not limited thereto. Directions in which the bubble supplying members 91, 92 and 93 supply (spout) the gas, respectively, may be varied, in addition to or in stead of changing the bubble supplying members 91, 92 and 93 used for supplying the gas into the cleaning tank 12 so as to form the bubble in the cleaning liquid. The bubble supplying members 91, 92 and 93 may be vertically moved. When bubble supplying members capable of varying gas supplying direction or of vertically moving are used, two or more pairs of gas supplying members do not need to be disposed at different position with respect to the vertical level. That is to say, if a pair of gas supplying members capable of varying gas supplying direction or of vertical moving is used, the gas supplying members can change a region with respect to the vertical level toward which the gas are supplied as bubbles into the cleaning tank 12.

The substrate cleaning system 10 shown in FIG. 14 includes a pair of bubble supplying members 94 disposed on the opposite sides, respectively, of wafers W placed in a cleaning tank 12. The paired bubble supplying members 94 are supported by support members 85, respectively, at the same height. The bubble supplying members 94 may be the same in construction as the bubble supplying members 91, 92 and 93 of the substrate cleaning system 10 in the modification 12-1. The support members 85 are connected to a driving mechanism, not shown. A control device 18 controls operations of the driving mechanism so as to move the support members 85 supporting the bubble supplying members 94 vertically.

A supply pipe 88 connected to a gas deliver device 82 connected to a gas source 83 is connected through the support members 85 to the bubble supplying members 94. The bubble supplying members 94 can supply the gas delivered by the gas deliver device 82 into the cleaning liquid contained in the cleaning tank 12 while the same are moved vertically. Thus the position from which the gas is supplied as bubbles into the cleaning liquid contained in the cleaning tank 12 can be changed vertically so that a region in the cleaning tank 12 toward which the bubbles are supplied during an ultrasonic cleaning process.

In the substrate cleaning system 10 shown in FIG. 14, the angular position of the bubble supplying members 94 relative to the support members 85 for example may be changed so as to change the bubble supplying direction in which the gas is supplied as bubbles through the bubble supplying members 94. The region in the cleaning tank 12 with respect to the vertical level toward which the gas is supplied as bubbles into the cleaning tank 12 may be changed only by changing the directions in which the gas is supplied as bubbles through the bubble supplying members 94 by changing the angular position of the bubble supplying members 94 relative to the support members 85 without moving the support members 85 relative to the cleaning tank 12.

Although the substrate cleaning methods, the substrate cleaning systems, the program and the storage medium according to the present invention has been described as applied to cleaning the wafers W, the present invention is not limited thereto. For example, the present invention is applicable to processing LCD substrates, CD substrates and the like.

What is claimed is:

1. A method of substrate cleaning with a cleaning tank, an ultrasonic generator and a plurality of supplying members with each supplying member of the plurality being positioned at a different vertical level within the tank, said method comprising the steps of:

immersing a semiconductor wafer in a cleaning liquid in the cleaning tank;

generating, with the ultrasonic generator, ultrasonic waves in the cleaning liquid while causing the plurality of supplying members to supply cleaning liquid into the tank; and during generating of ultrasonic waves and while the plurality of supplying members are supplying cleaning liquid, changing a cleaning liquid supply rate of at least one supplying member so as to change the amount of cleaning liquid supplied at the level corresponding to said at least one supplying member, changing a cleaning supply rate of at least another supplying member so as to change the amount of cleaning liquid supplied at the level corresponding to said at least another supplying member, and causing different members of the supplying members to simultaneously supply the cleaning liquid at different dissolved gas concentrations.

2. The substrate cleaning method according to claim 1, wherein bubbles are supplied together with the cleaning liquid into the cleaning tank through at least one of the supplying members in the step of generating ultrasonic waves in the cleaning liquid while the cleaning liquid is being supplied into the cleaning tank, and a bubble supplying rate at which the bubbles are supplied through said at least one of the supplying members is varied in the same step.

3. The substrate cleaning method according to claim 1, wherein bubbles are supplied together with the cleaning liquid into the cleaning tank through at least one of the supplying members in the step of generating ultrasonic waves in the cleaning liquid while the cleaning liquid is being supplied into the cleaning tank, and the number of bubbles supplied in a unit time through said at least one of the supplying members is varied in the same step.

4. The substrate cleaning method according to claim 1, wherein a first supplying rate at which the cleaning liquid is supplied through a first of the supplying members and a second supplying rate at which the cleaning liquid is supplied through a second of the supplying members are different, the first of the supplying members and the second of the supplying members being disposed at a different vertical position within the cleaning tank.

5. The substrate cleaning method according to claim 1, wherein bubbles are supplied together with the cleaning liquid into the cleaning tank through at least two of the supplying members in the step of generating ultrasonic waves in the cleaning liquid while the cleaning liquid is being supplied into the cleaning tank, and a bubble supplying rate at which the bubbles are supplied through a first of the at least two supplying members and a bubble supplying rate at which the bubbles are supplied through a second of the at least two supplying members are different, the first of the at least two supplying members and the second of the at least two supplying members being disposed at a different vertical position within the cleaning tank.

6. The substrate cleaning method according to claim 1, wherein bubbles are supplied together with the cleaning liquid into the cleaning tank through at least two of the supplying members in the step of generating ultrasonic waves in the cleaning liquid while the cleaning liquid is being supplied into the cleaning tank, and the number of bubbles supplied in a unit time through a first of the at least two supplying members and the number of bubbles supplied in a unit time through a second of the at least two supplying members are different, the first of the at least two supplying members and the second of the at least two supplying members being disposed at a different vertical position within the cleaning tank.

7. A storage medium storing a program to be carried out by a control device for controlling a substrate processing system so as to accomplish a substrate processing method according to claim 1.

8. The substrate cleaning method according to claim 1, wherein the dissolved gas concentration of the cleaning liquid supplied through at least one of the supplying members is varied in the step of generating ultrasonic waves in the cleaning liquid.

* * * * *